United States Patent
Kito et al.

(10) Patent No.: US 8,148,789 B2
(45) Date of Patent: Apr. 3, 2012

(54) NON-VOLATILE SEMICONDUCTOR STORAGE DEVICE AND METHOD OF MANUFACTURING THE SAME

(75) Inventors: Masaru Kito, Yokohama (JP); Ryota Katsumata, Yokohama (JP); Masaru Kidoh, Komae (JP); Hiroyasu Tanaka, Tokyo (JP); Yoshiaki Fukuzumi, Yokohama (JP); Hideaki Aochi, Kawasaki (JP); Yasuyuki Matsuoka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 241 days.

(21) Appl. No.: 12/260,589

(22) Filed: Oct. 29, 2008

(65) Prior Publication Data

US 2009/0108333 A1 Apr. 30, 2009

(30) Foreign Application Priority Data

Oct. 29, 2007 (JP) ................................. 2007-280091

(51) Int. Cl.
*H01L 21/02* (2006.01)
(52) U.S. Cl. ........ 257/410; 257/315; 257/331; 257/332; 257/333; 257/E21.581
(58) Field of Classification Search .......... 257/331–333, 257/E21.336, E21.345, 315, 410, E21.581
See application file for complete search history.

(56) References Cited

U.S. PATENT DOCUMENTS

| | | | |
|---|---|---|---|
| 5,599,724 A | | 2/1997 | Yoshida |
| 5,617,351 A | * | 4/1997 | Bertin et al. ............. 365/185.05 |
| 5,707,885 A | | 1/1998 | Lim |
| 5,864,160 A | * | 1/1999 | Buynoski ...................... 257/339 |
| 5,990,532 A | * | 11/1999 | Gardner ......................... 257/410 |
| 6,933,556 B2 | * | 8/2005 | Endoh et al. ................. 257/315 |
| 2002/0154556 A1 | * | 10/2002 | Endoh et al. ................. 365/200 |
| 2006/0261402 A1 | * | 11/2006 | Lue et al. ...................... 257/316 |
| 2007/0252201 A1 | | 11/2007 | Kito et al. |
| 2008/0186771 A1 | | 8/2008 | Katsumata et al. |

FOREIGN PATENT DOCUMENTS

| | | |
|---|---|---|
| JP | 2003-78044 | 3/2003 |
| JP | 2007-266143 | 10/2007 |
| KR | 10-0482258 | 2/2003 |
| KR | 10-2005-0016108 | 2/2005 |
| KR | 10-2007-0096972 | 10/2007 |

OTHER PUBLICATIONS

U.S. Appl. No. 12/534,576, filed Aug. 3, 2009, Kito, et al.
U.S. Appl. No. 12/708,161, filed Feb. 18, 2010, Fukuzumi et al.
U.S. Appl. No. 12/521,997, filed Jul. 2, 2009, Kidoh, et al.
U.S. Appl. No. 12/325,711, filed Dec. 1, 2008, Fukuzumi, et al.
Notice of Allowance issued Oct. 28, 2010, in Korea Patent Application No. 2010-049017187.

* cited by examiner

*Primary Examiner* — Wael Fahmy
*Assistant Examiner* — John C Ingham
(74) *Attorney, Agent, or Firm* — Oblon, Spivak, McClelland, Maier & Neustadt, L.L.P.

(57) ABSTRACT

A non-volatile semiconductor storage device has a plurality of memory strings with a plurality of electrically rewritable memory cells connected in series. Each of the memory strings includes: a first columnar semiconductor layer extending in a direction perpendicular to a substrate; a charge accumulation layer formed on the first columnar semiconductor layer via a first air gap and accumulating charges; a block insulation layer contacting the charge accumulation layer; and a plurality of first conductive layers contacting the block insulation layer.

5 Claims, 24 Drawing Sheets

NON-VOLATILE SEMICONDUCTOR STORAGE DEVICE AND METHOD OF MANUFACTURING THE SAME

CROSS-REFERENCE TO RELATED APPLICATIONS

This application is based upon and claims the benefit of priority from the prior Japanese Patent Application No. 2007-280091, filed on Oct. 29, 2007, the entire contents of which are incorporated herein by reference.

BACKGROUND OF THE INVENTION

1. Field of the Invention

The present invention relates to electrically rewritable semiconductor storage devices, and in particular to, among these, a non-volatile semiconductor storage device and a method of manufacturing the same.

2. Description of the Related Art

Conventionally, LSIs are formed by integration of devices in a two-dimensional plane on the silicon substrate. Although the dimension for each device must be reduced (refinement) to increase memory storage capacity, recent years are facing challenges in such refinement from the viewpoint of cost and technology. Such refinement requires further improvements in photolithography technology. However, in currently available ArF immersion lithography technology, for example, the resolution limit has been reached around the 40 nm design rule and so EUV exposure devices have to be introduced for further refinement. However, the EUV exposure devices are expensive and infeasible in view of the costs. In addition, if such refinement is accomplished, it is assumed that physical improvement limit, such as in breakdown voltage between devices, would be reached unless driving voltage can be scaled, for example. Accordingly, it is likely that difficulties would be encountered in device operation itself.

Therefore, a large number of semiconductor storage devices have been proposed recently where memory cells are arranged in a three-dimensional manner to achieve improved integration of memory devices (see, Patent Document 1: Japanese Patent Laid-Open No. 2003-078044; Patent Document 2: U.S. Pat. No. 5,599,724; and Patent Document 3: U.S. Pat. No. 5,707,885).

One of the conventional semiconductor storage devices where memory cells are arranged in a three-dimensional manner uses transistors with a SGT (cylinder-type) structure (see, Patent Documents 1-3). Those semiconductor storage devices using transistors with a SGT (cylinder-type) structure are provided with multiple layers of polysilicon corresponding to gate electrodes and pillar-like columnar semiconductors. Each of the columnar semiconductors serves as a channel (body) part of each of the transistors. A plurality of charge accumulation layers are provided around the columnar semiconductors via tunnel insulation layers for accumulating charges. Further, block insulation layers are formed around the charge accumulation layers. Such configurations including polysilicon, columnar semiconductors, tunnel insulation layers, charge accumulation layers, and block insulation layers are referred to as "memory strings".

In the aforementioned conventional technology, columnar semiconductors are first formed, around which tunnel insulation layers, charge accumulation layers, block insulation layers, and gate electrodes are sequentially formed. Such way of formation, however, requires a large number of manufacturing steps and thus becomes cumbersome.

SUMMARY OF THE INVENTION

One aspect of the present invention provides a non-volatile semiconductor storage device comprising a plurality of memory strings with a plurality of electrically rewritable memory cells connected in series, wherein each of the memory strings comprises: a first columnar semiconductor layer extending in a direction perpendicular to a substrate; a charge accumulation layer formed on the first columnar semiconductor layer via a first air gap and accumulating charges; a block insulation layer contacting the charge accumulation layer; and a plurality of first conductive layers contacting the block insulation layer.

In addition, another aspect of the present invention provides a non-volatile semiconductor storage device comprising a plurality of memory strings with a plurality of electrically rewritable memory cells connected in series, wherein each of the memory strings comprises: a first columnar semiconductor layer extending in a direction perpendicular to a substrate; a tunnel insulation layer contacting the first columnar semiconductor layer; a charge accumulation layer contacting the tunnel insulation layer and accumulating charges; a block insulation layer contacting the charge accumulation layer; and a plurality of first conductive layers contacting the block insulation layer, and wherein the tunnel insulation layer has a first air gap or a seam.

In addition, another aspect of the present invention provides a non-volatile semiconductor storage device comprising a non-volatile semiconductor storage device comprising a plurality of memory strings with a plurality of electrically rewritable memory cells connected in series, and a selection gate transistor controlling whether to conduct current to the memory strings, wherein the selection gate transistor comprises: a second columnar semiconductor layer extending in a direction perpendicular to a substrate; and a second conductive layer formed on the second columnar semiconductor layer via a second air gap.

In addition, another aspect of the present invention provides a non-volatile semiconductor storage device comprising a plurality of memory strings with a plurality of electrically rewritable memory cells connected in series, and a selection gate transistor controlling whether to conduct current to the memory strings, wherein the selection gate transistor comprises: a second columnar semiconductor layer extending in a direction perpendicular to a substrate; a gate insulation layer contacting the second columnar semiconductor layer; and a second conductive layer contacting the gate insulation layer, and wherein the gate insulation layer has a second air gap or a seam.

Further, still another aspect of the present invention provides a method of manufacturing a non-volatile semiconductor storage device having a plurality of memory strings with a plurality of electrically rewritable memory cells connected in series, the method comprising: alternately laminating interlayer insulation layers and first conductive layers; forming a first hole to penetrate the interlayer insulation layers and the first conductive layers; sequentially forming a first insulation layer, a charge accumulation layer, a first sacrificial layer, and a first columnar semiconductor layer on the side surface of the first hole; and removing the first sacrificial layer to form a first air gap between the first columnar semiconductor layer and the charge accumulation layer.

DETAILED DESCRIPTION OF THE EMBODIMENTS

Embodiments of a non-volatile semiconductor storage device according to the present invention will now be described below with reference to the accompanying drawings.

[First Embodiment]

(Configuration of Non-Volatile Semiconductor Storage Device 100 in First Embodiment)

Figure 1:
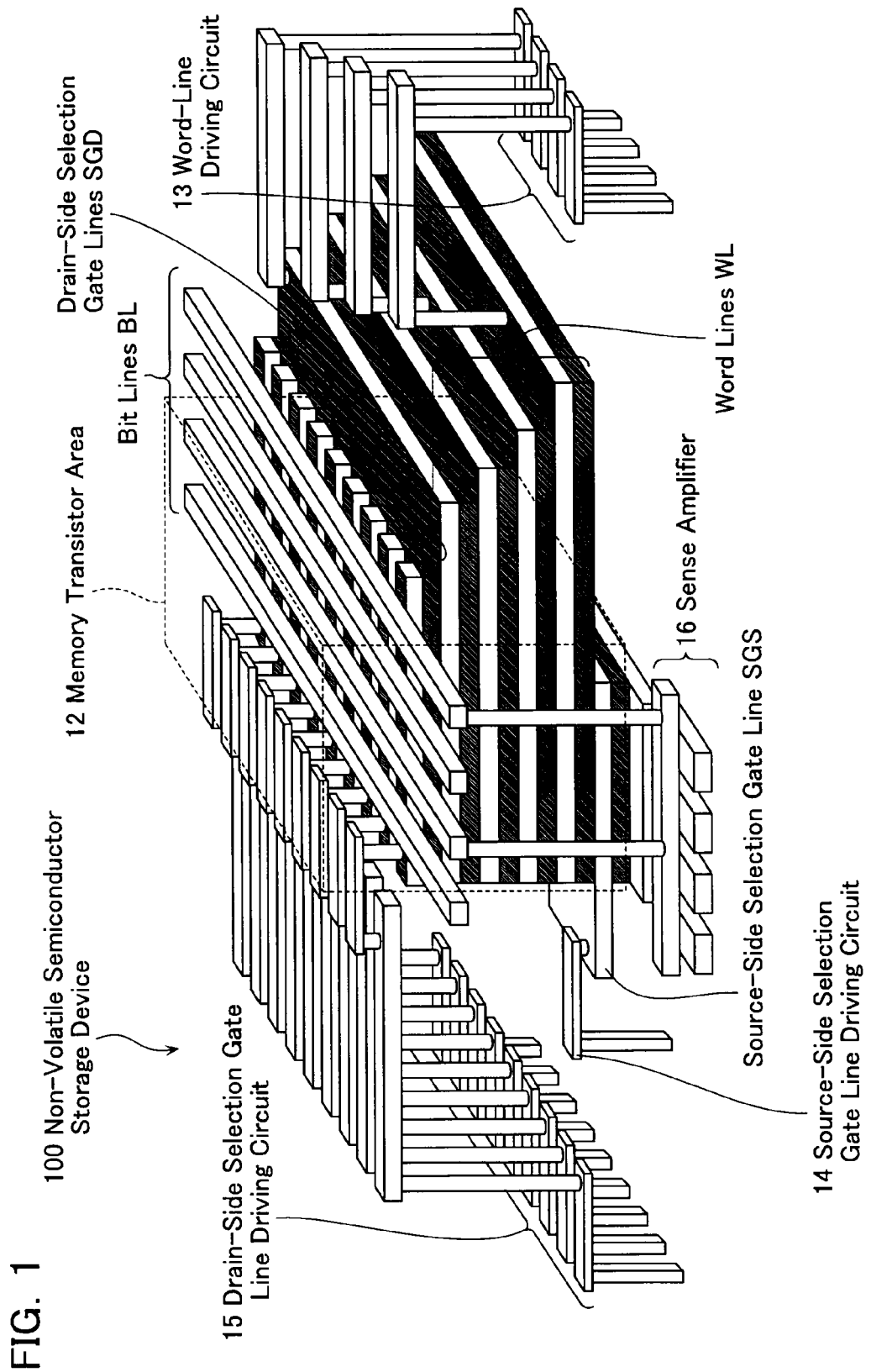
FIG. 1 is a schematic configuration diagram of a non-volatile semiconductor storage device according to a first embodiment of the present invention.

FIG. 1 schematically illustrates a non-volatile semiconductor storage device 100 according to a first embodiment of the present invention. As illustrated in FIG. 1, the non-volatile semiconductor storage device 100 according to the first embodiment mainly comprises: a memory transistor area 12; a word-line driving circuit 13; a source-side selection gate line (SGS) driving circuit 14; a drain-side selection gate line (SGD) driving circuit 15; and a sense amplifier 16. The memory transistor area 12 has memory transistors for storing data. The word-line driving circuit 13 controls voltage applied to word lines WL. The source-side selection gate line (SGS) driving circuit 14 controls voltage applied to the source-side selection gate line SGS. The drain-side selection gate line (SGD) driving circuit 15 controls voltage applied to drain-side selection gate lines SGD. The sense amplifier 16 amplifies a potential read from a memory transistor. In addition to this, the non-volatile semiconductor storage device 100 according to the first embodiment comprises a bit-line driving circuit for controlling voltage applied to bit lines BL and a source-line driving circuit for controlling voltage applied to source lines SL (not illustrated).

In addition, as illustrated in FIG. 1, in the non-volatile semiconductor storage device 100 according to the first embodiment, the memory transistors that configure the memory transistor area 12 are formed by lamination of a plurality of semiconductor layers. In addition, as illustrated in FIG. 1, a word line WL of each layer expands in a certain area in a two-dimensional manner. The word line WL of each layer has a planar structure of the same layer, respectively, providing a planar plate-like structure.

Figure 2:
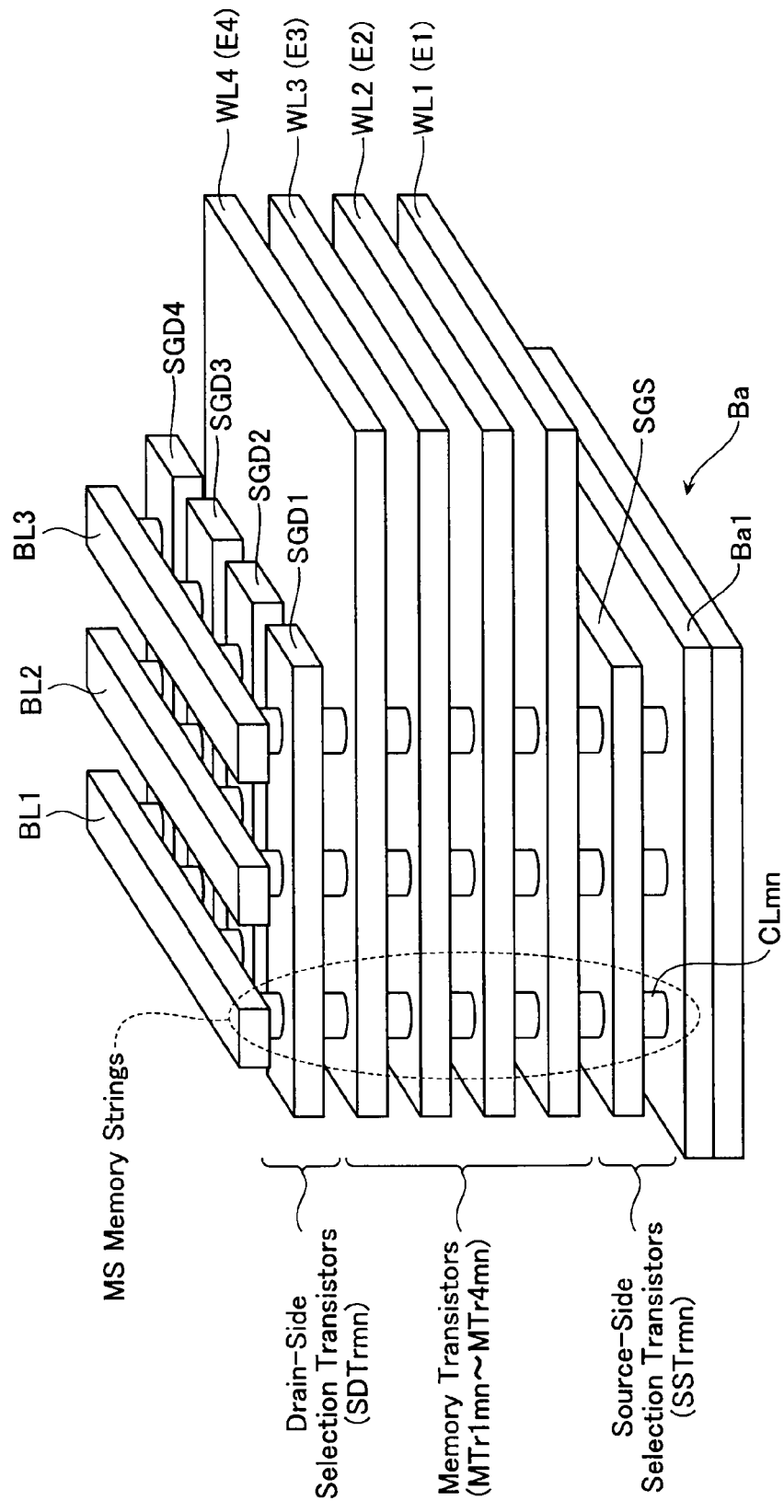
FIG. 2 is a perspective view schematically illustrating a part of the memory transistor area 12 in the non-volatile semiconductor storage device according to the first embodiment of the present invention.

FIG. 2 is a schematic configuration diagram illustrating a part of the memory transistor area 12 in the non-volatile semiconductor storage device 100 according to the first embodiment. According to the first embodiment, the memory transistor area 12 has m×n (m, n=natural number) memory strings MS including memory transistors MTr1$mn$ to MTr4$mn$ as well as a source-side selection transistor SSTrmn and drain-side selection transistors SDTrmn. In FIG. 2, given that m=3, n=4.

In each of the memory strings MS, each of word lines WL1 to WL4 connected to the gate of each of the memory transistors MTr1$mn$ to MTr4$mn$ is formed by the same conductive film and used in common therein. That is, in each of the memory strings MS, all gates of the memory transistor MTr1$mn$ are connected to the word line WL1. In addition, in each of the memory strings MS, all gates of the memory transistor MTr2$mn$ are connected to the word line WL2. In addition, in each of the memory strings MS, all gates of the memory transistor MTr3*mn* are connected to the word line WL3. In addition, in each of the memory strings MS, all gates of the memory transistor MTr4*mn* are connected to the word line WL4. As illustrated in FIGS. 1 and 2, in the non-volatile semiconductor storage device 100 according to the first embodiment, each of the word lines WL1 to WL4 expands in a two-dimensional manner and has a planar plate-like structure. In addition, the word lines WL1 to WL4 are arranged substantially perpendicular to the respective memory strings MS.

Each of the memory strings MS has columnar semiconductors CLmn (in the case of FIG. 2, m=1 to 3, n=1 to 4) provided on an N+ area formed on a P-well area Ba1 of a semiconductor substrate Ba. Each of the columnar semiconductors CLmn is formed in a direction perpendicular to the semiconductor substrate Ba and arranged in a matrix form on the surfaces of the semiconductor substrate Ba and the word lines WL1 to WL4. That is, each of the memory strings MS is also arranged in a matrix form within a plane perpendicular to the corresponding columnar semiconductor CLmn. Besides, the columnar semiconductors CLmn may be columnar or prismatic in shape. In addition, the columnar semiconductors CLmn include terraced columnar semiconductors.

Further, as illustrated in FIG. 2, provided on the upper portions of the memory strings MS are drain-side selection gate lines SGD with rectangular plate shapes (in the case of FIG. 2, SGD1 to SGD4), which contact columnar semiconductors CLmn via insulating films (not illustrated) to configure respective drain-side selection transistors SDTrmn. The drain-side selection gate lines SGD are insulated and isolated from each other and, unlike the word lines WL1 to WL4, formed in parallel on the semiconductor substrate Ba in a stripe form. In addition, provided at the center in the width direction of the drain-side selection gate lines SGD are columnar semiconductors CLmn, each of which is formed to penetrate that center.

Further, as illustrated in FIG. 2, provided on the lower portions of the memory strings MS is a source-side selection gate line SGS, which contact the columnar semiconductors CLmn via insulating films (not illustrated) to configure respective source-side selection transistors SSTrmn. The source-side selection gate line SGS has a planar plate-like structure that expands in a two-dimensional manner as the word lines WL1 to WL4.

Figure 3:
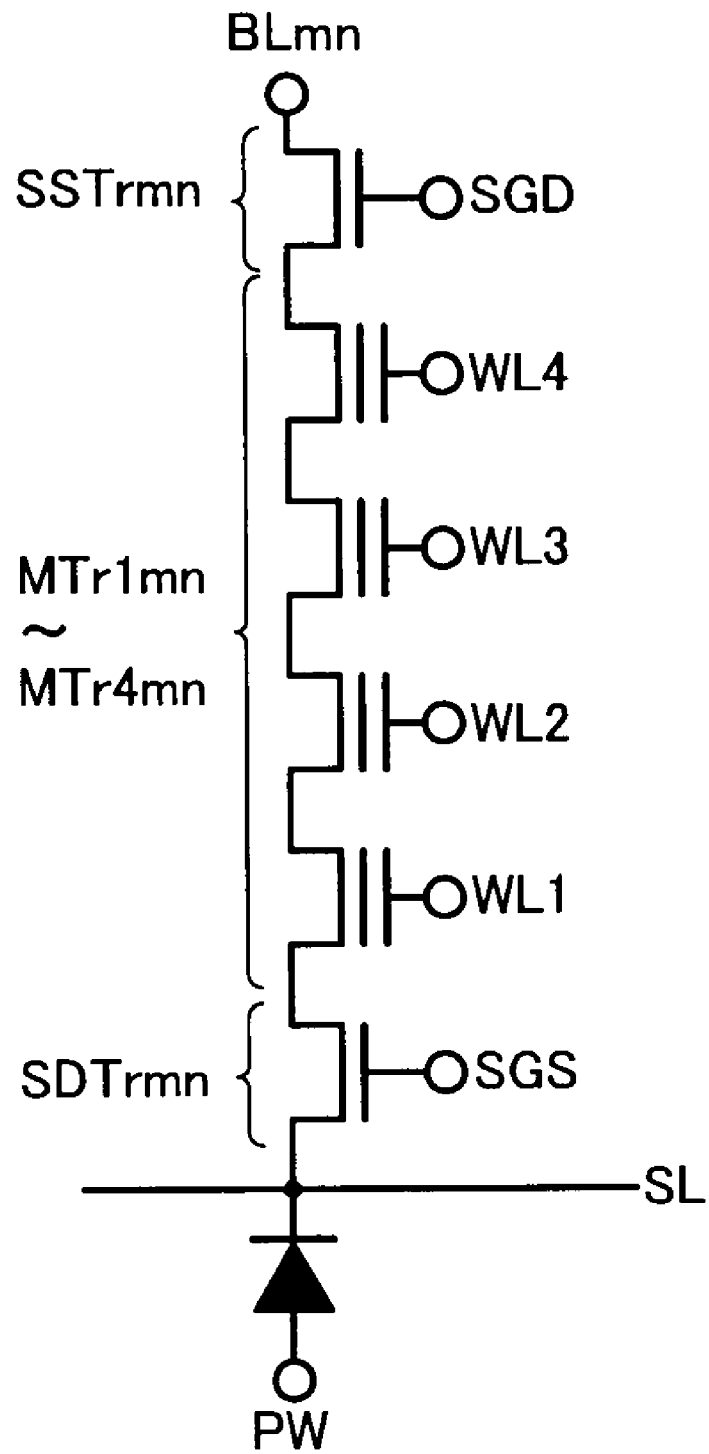
FIG. 3 is a circuit diagram illustrating one of the memory strings MS according to the first embodiment of the present invention.

Referring now to FIGS. 2 and 3, the circuit configuration and operation of the memory strings MS of the first embodiment will be described below. FIG. 3 is a circuit diagram illustrating one of the memory strings MS according to the first embodiment.

As illustrated in FIGS. 2 and 3, in the first embodiment, each of the memory strings MS has four memory transistors MTr1*mn* to MTr4*mn* as well as a source-side selection transistor SSTrmn and drain-side selection transistors SDTrmn. These four memory transistors MTr1*mn* to MTr4*mn* as well as the source-side selection transistor SSTrmn and the drain-side selection transistors SDTrmn are connected in series to each other (see FIG. 3). According to the first embodiment, in each of the memory strings MS, a columnar semiconductor CLmn is formed on an N+ area that is formed in a P-type area (P-well area) Ba1 on the semiconductor substrate Ba.

In addition, a source line SL (an N+ area formed in the P-well area Ba1 on the semiconductor substrate Ba) is connected to the source of each source-side selection transistor SSTrmn. Further, bit lines BL are connected to the drains of the drain-side selection transistors SDTrmn.

Each of the memory transistors MTrmn has a columnar semiconductor CLmn, a charge accumulation layer formed to surround the columnar semiconductor CLmn, and a word line WL formed to surround the charge accumulation layer. One end of each word line WL that is surrounded by a respective insulating film and contacts a respective charge accumulation layer functions as a control gate electrode CG of each memory transistor MTrmn. The sources and drains of the memory transistors MTrmn are formed at the columnar semiconductors CLmn.

In the non-volatile semiconductor storage device 100 with the above-mentioned configuration, respective voltages of the bit lines BL1 to BL3, the drain-side selection gate lines SGD, the word lines WL1 to WL4, the source-side selection gate line SGS, and the source lines SL are controlled by bit line driving circuits (not illustrated), the drain-side selection gate line driving circuit 15, the word line driving circuits 13, the source-side selection gate line driving circuit 14, and a source line driving circuit (not illustrated). That is, data is read, written and erased by controlling charges of the charge accumulation layer in a predetermined memory transistor MTrmn.

(Specific Configuration of Memory Strings MS in First Embodiment)

Figure 4:
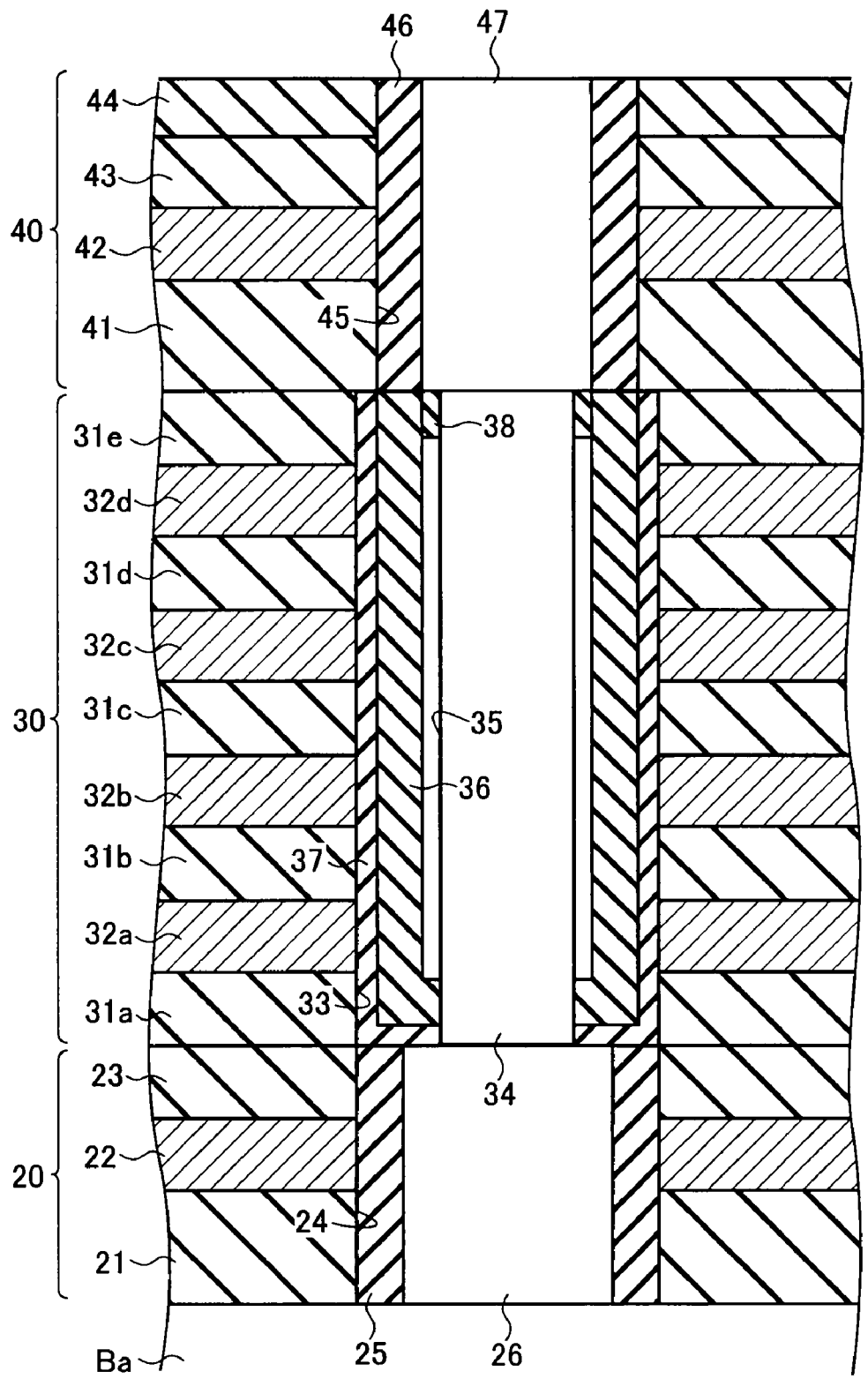
FIG. 4 is a diagram illustrating a cross-sectional structure of one of memory strings MS according to the first embodiment.

Referring now to FIG. 4, a further specific configuration of one of the memory strings MS will be described below. FIG. 4 is a diagram illustrating a cross-sectional structure of one of the memory strings MS according to the first embodiment. As illustrated in FIG. 4, each of the memory strings MS has, from lower layer to upper layer, a source-side selection transistor layer 20, a memory transistor layer 30, and a drain-side selection transistor layer 40. The source-side selection transistor layer 20 functions as a source-side selection transistor SSTrmn. The memory transistor layer 30 functions as a memory transistor MTrmn. The drain-side selection transistor layer 40 functions as a drain-side selection transistor SDTrmn.

The source-side selection transistor layer 20 has a source-side first insulation layer 21 formed on the semiconductor substrate Ba, a source-side conductive layer (second conductive layer) 22 formed on the top surface of the source-side first insulation layer 21, and a source-side second insulation layer 23 formed on the top surface of the source-side conductive layer 22. The source-side first insulation layer 21 and the source-side second insulation layer 23 are composed of, e.g., silicon oxide. In addition, the source-side conductive layer 22 is composed of, e.g., polysilicon. Note that one end of the source-side conductive layer 22 functions as a control gate of the source-side selection transistor SSTrmn.

In addition, the source-side selection transistor layer 20 has a source-side hole 24 that is formed to penetrate the source-side first insulation layer 21, the source-side conductive layer 22, and the source-side second insulation layer 23. The source-side hole 24 has a source-side columnar semiconductor layer (second columnar semiconductor layer) 26 provided therein via a source-side gate insulation layer 25. The source-side gate insulation layer 25 is formed by HTO. The source-side columnar semiconductor layer 26 is formed by amorphous silicon. Note that HTO is an oxide film TEOS based on high temperature deposition.

The memory transistor layer 30 has first to fifth insulation layers between word lines 31*a* to 31*e* that are provided over the source-side second insulation layer 23, and first to fourth word-line conductive layers (first conductive layers) 32*a* to 32*d* that are provided one above the other with the first to fifth insulation layers between word lines 31*a* to 31*e*, respectively. For example, the first to fifth insulation layers between word lines 31*a* to 31*e* are composed of, e.g., silicon oxide. In addition, the first to fourth word-line conductive layers 32*a* to 32*d* are composed of, e.g., polysilicon. The first to fourth word-line conductive layers 32a to 32d function as the above-mentioned word lines WL1 to WL4.

In addition, the memory transistor layer 30 has a memory hole 33 that is formed to penetrate the first to fifth insulation layers between word lines 31a to 31e and the first to fourth word-line conductive layers 32a to 32d, and a memory columnar semiconductor layer (first columnar semiconductor layer) 34 that is formed within the memory hole 33. The memory columnar semiconductor layer 34 is formed by amorphous silicon.

The memory transistor layer 30 further has a charge accumulation layer 36 that is formed on the memory columnar semiconductor layer 34 via an air gap 35 and accumulates charges, and a block insulation layer 37 that contacts the charge accumulation layer 36. The block insulation layer 37 contacts the first to fourth word line conductive layers 32a to 32d. The charge accumulation layer 36 is formed by silicon nitride (SiN). The block insulation layer 37 is formed by HTO. The block insulation layer 37 may be formed by ALD-$SiO_2$ or LPCVD. In addition, a sealing and insulating layer 38 is formed on the upper portion of the memory transistor layer 30 and between the memory columnar semiconductor layer 34 and the charge accumulation layer 36, sealing the top of the space made by the air gap 35. The sealing and insulating layer 38 is formed by silicon oxide. The sealing and insulating layer 38 is formed in such a way that its top surface is set at substantially the same position as that of the memory columnar semiconductor layer 34.

The drain-side selection transistor layer 40 has a drain-side first insulation layer 41 that is formed on the fifth insulation layer between word lines 31e, a drain-side conductive layer (second conductive layer) 42 that is formed on the top surface of the drain-side first insulation layer 41, a drain-side second insulation layer 43 that is formed on the top surface of the drain-side conductive layer 42, and a isolation and insulation layer 44 that is formed on the top surface of the drain-side second insulation layer 43. The drain-side first insulation layer 41 and the drain-side second insulation layer 43 are formed by silicon oxide. The drain-side conductive layer 42 is formed by polysilicon. The isolation and insulation layer 44 is formed by silicon nitride. Note that one end of the drain-side conductive layer 42 functions as a control gate of the drain-side selection transistors SDTrmn.

In addition, the drain-side selection transistor layer 40 has a drain-side hole 45 that is formed to penetrate the drain-side first insulation layer 41, the drain-side conductive layer 42, the drain-side second insulation layer 43, and the isolation and insulation layer 44. The drain-side hole 45 has a drain-side columnar semiconductor layer (second columnar semiconductor layer) 47 provided therein via a drain-side gate insulation layer 46. The drain-side gate insulation layer 46 is formed by HTO. The drain-side columnar semiconductor layer 47 is formed by amorphous silicon.

(Manufacturing Process of Memory Strings MS in First Embodiment)

Referring now to FIGS. 5 through 10, a manufacturing process of one of the memory strings MS according to the first embodiment will be described below. Note that some of the first to fifth insulation layers between word lines 31a to 31e and some of the first to fourth word-line conductive layers 32a to 32d are omitted from FIGS. 5 through 10.

Figure 5:
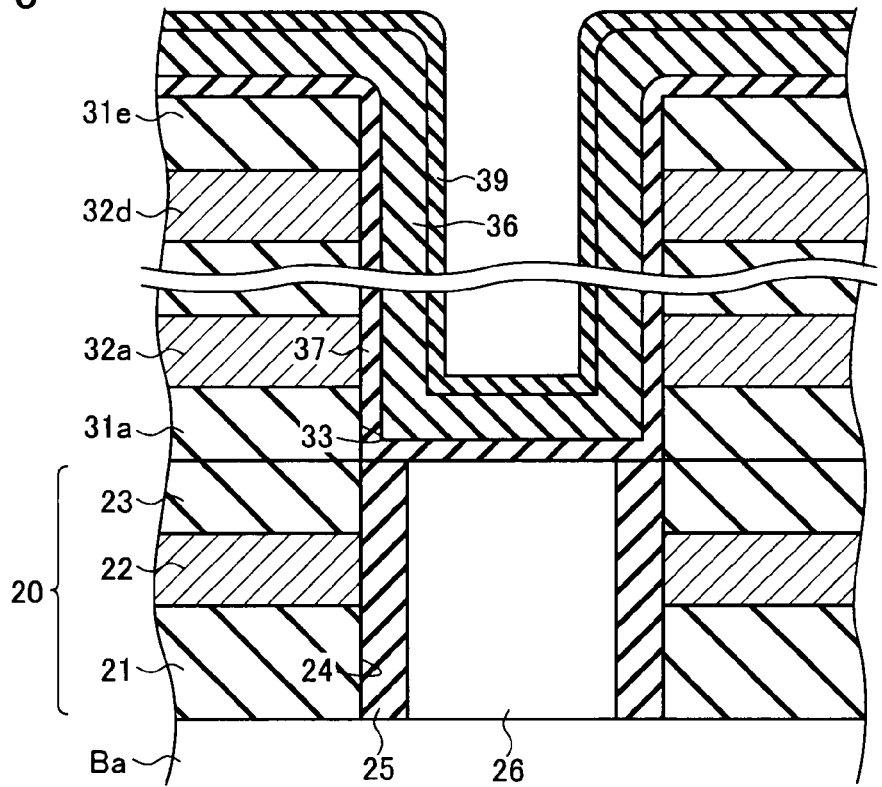
FIG. 5 is a cross-sectional view of one of the memory strings MS in a first manufacturing process according to the first embodiment.

Firstly, a source-side selection transistor layer 20 is formed on the substrate Ba. Secondly, amorphous silicon and silicon oxide are alternately laminated over the source-side selection transistor layer 20 to form first to fifth insulation layers between word lines (interlayer insulation layers) 31a to 31e and first to fourth word-line conductive layers (first conductive layers) 32a to 32d. Thirdly, a memory hole (first hole) 33 is formed to penetrate the first to fifth insulation layers between word lines 31a to 31e and the first to fourth word-line conductive layers 32a to 32d. Thereafter, HTO, silicon nitride, and silicon germanium (SiGe) are sequentially laminated within the memory hole 33 to form a block insulation layer (first insulation layer) 37, a charge accumulation layer 36, and a sacrificial layer (first sacrificial layer) 39. The resulting state of this process is depicted in FIG. 5. For example, after depositing an HTO film with a thickness of 7 nm, densify-annealing is performed (e.g., $N_2$, for 10 minutes at 800 degrees C.) to form a silicon nitride layer with a thickness of 5 nm and then a silicon-germanium thin film is deposited with a thickness of 2 nm.

Figure 6:
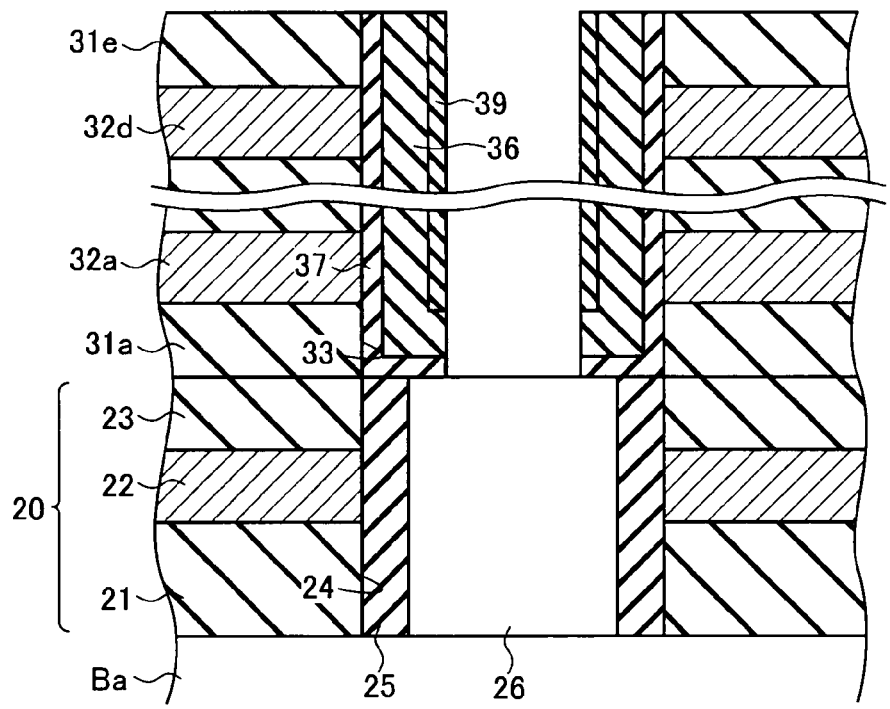
FIG. 6 is a cross-sectional view of one of the memory strings MS in the first manufacturing process according to the first embodiment.

Then, those portions of the block insulation layer 37, the charge accumulation layer 36, and the sacrificial layer 39 are removed by Reactive Ion Etching (RIE) that are located at the upper portion of the bottom surface of the memory hole 33 and the top surface of the fifth insulation layer between word lines 31e, and the process is advanced to a state as illustrated in FIG. 6. Further, hydrofluoric acid treatment is performed to remove any natural oxide film that is formed on the top surface of the source-side columnar semiconductor layer 26 exposed on the bottom surface of the memory hole 33.

Figure 7:
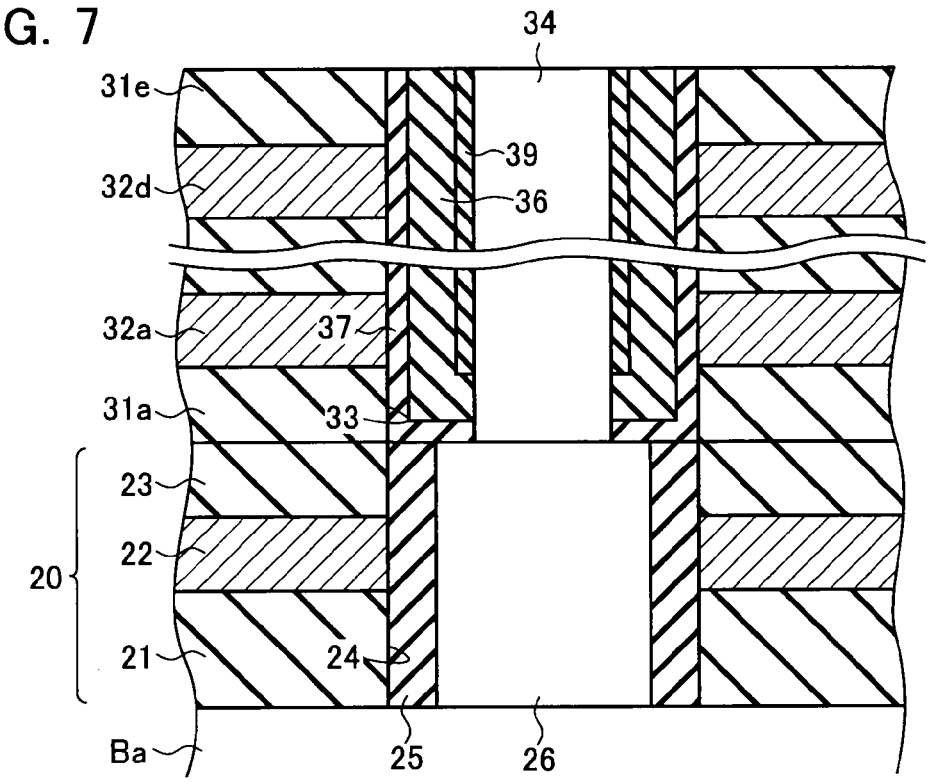
FIG. 7 is a cross-sectional view of one of the memory strings MS in the first manufacturing process according to the first embodiment.

Then, as illustrated in FIG. 7, amorphous silicon is deposited in such a way that it comes in contact with the side surface of the sacrificial layer 39 within the memory hole 33, thereby forming a memory columnar semiconductor layer 34.

Figure 8:
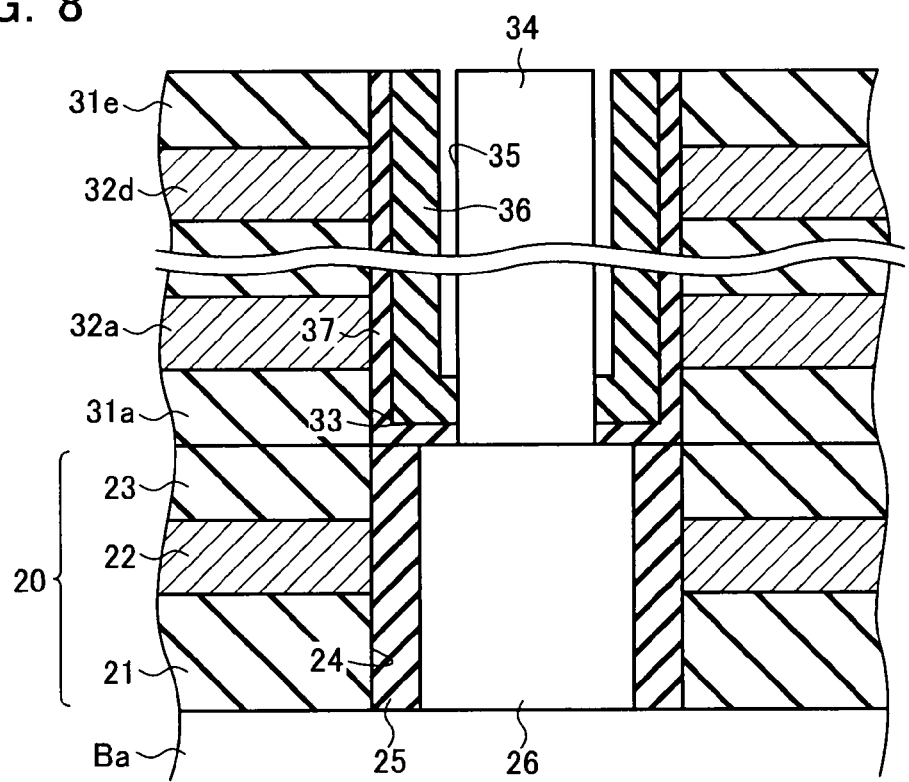
FIG. 8 is a cross-sectional view of one of the memory strings MS in the first manufacturing process according to the first embodiment.

Then, as illustrated in FIG. 8, the sacrificial layer 39 is removed by selective etching. Note that the selective etching is performed in, e.g., a $ClF_3$ vapor atmosphere since the sacrificial layer 39 is of silicon germanium. Through this process, removing the sacrificial layer 39 by selective etching provides a hollow cylindrical air gap (trench) 35 formed between the memory columnar semiconductor layer 34 and the block insulation layer 37.

Figure 9:
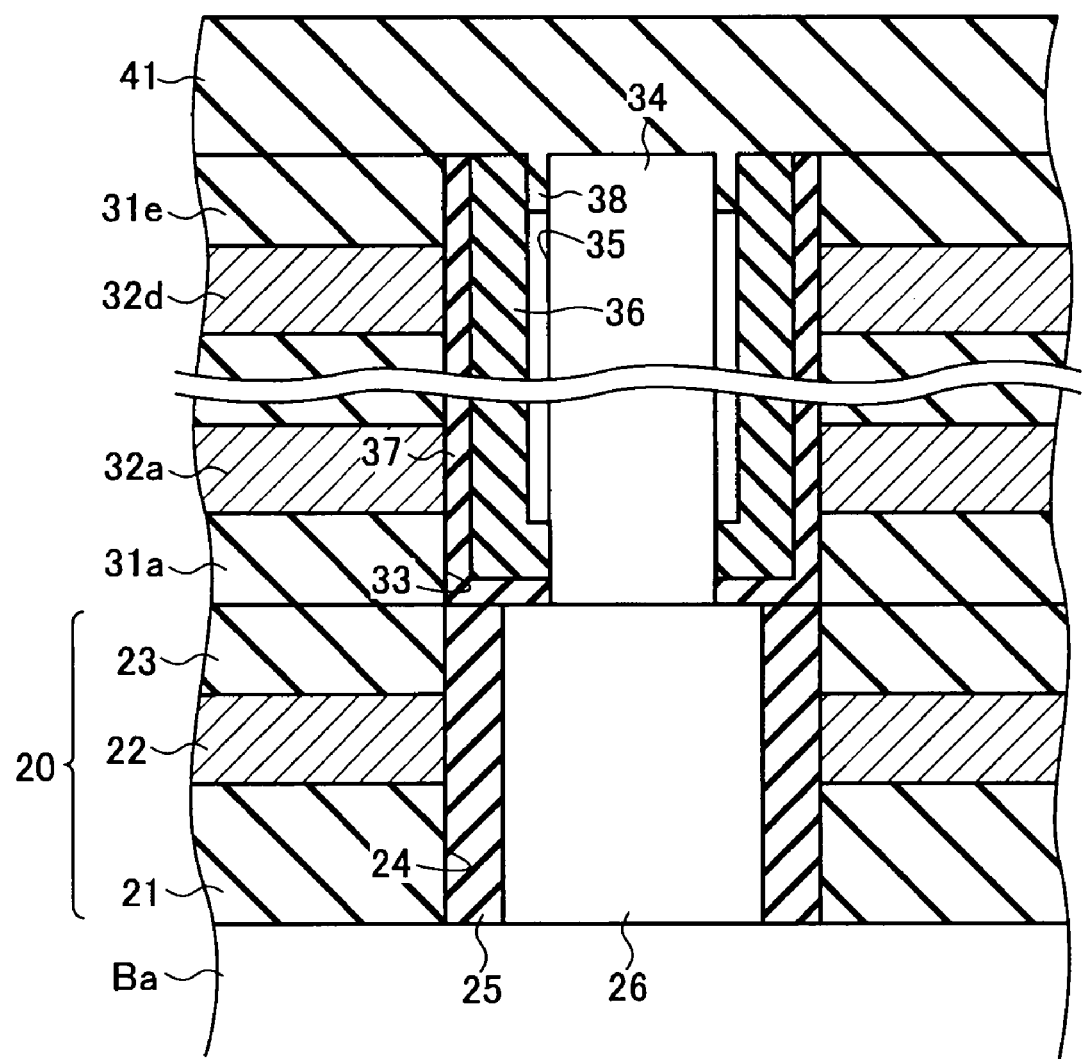
FIG. 9 is a cross-sectional view of one of the memory strings MS in the first manufacturing process according to the first embodiment.

Then, as illustrated in FIG. 9, a silicon oxide film is formed by a process with poor embedding property (coverage) (e.g., plasma CVD). Through this process with poor embedding property (coverage), a sealing and insulating layer 38 is formed in the upper aperture of the air gap 35 without filling up the entire air gap 35 with the silicon oxide film. Note that those portions excluding the sealing and insulating layer 38 within the formed silicon oxide film become the drain-side first insulation layer 41.

Figure 10:
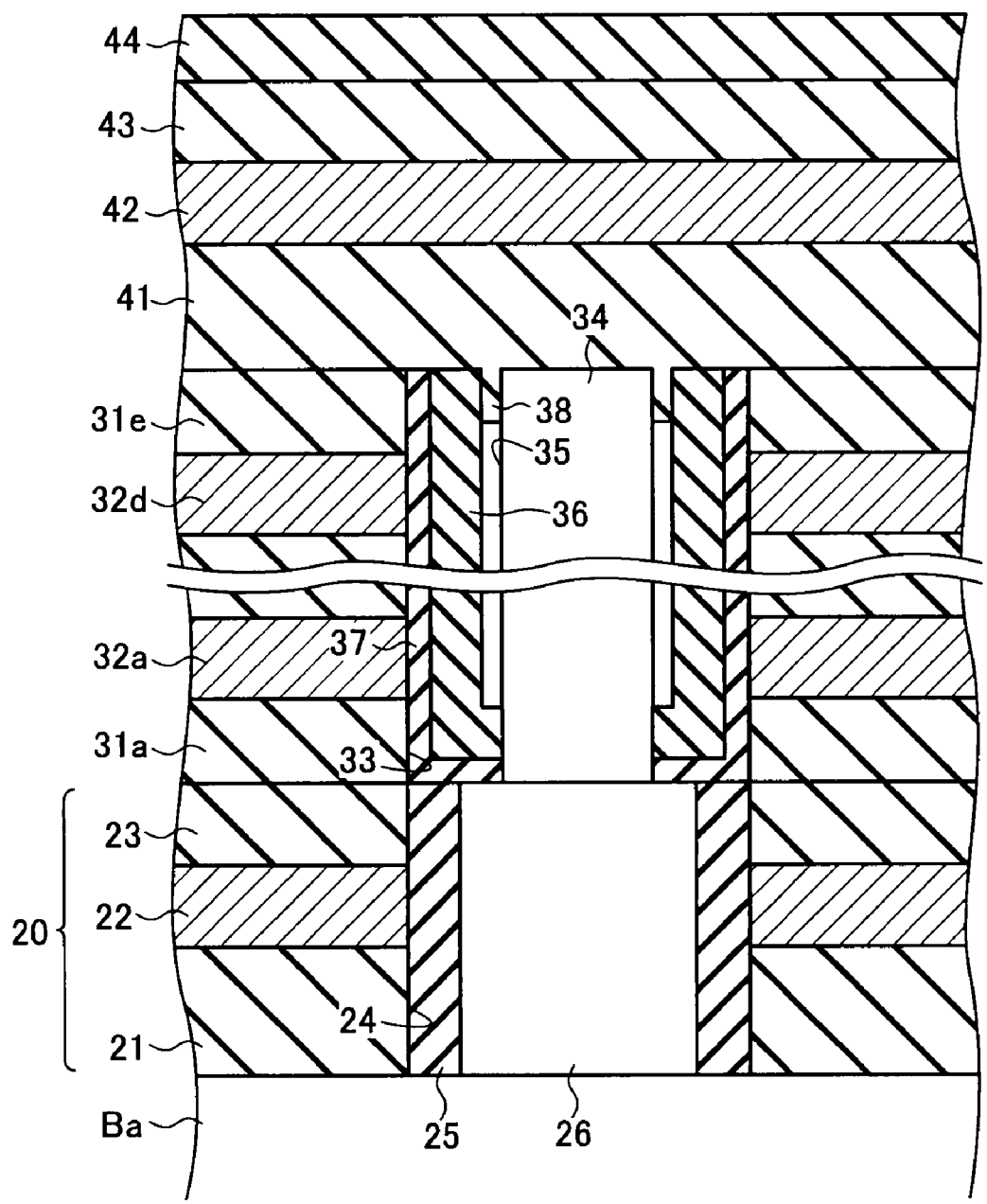
FIG. 10 is a cross-sectional view of one of the memory strings MS in the first manufacturing process according to the first embodiment.

Then, as illustrated in FIG. 10, polysilicon, silicon oxide, and silicon nitride are sequentially laminated on the drain-side first insulation layer 41 to form a drain-side conductive layer 42, a drain-side second insulation layer 43, and an isolation and insulation layer 44.

Then, a drain-side hole (second hole) 45 is formed to penetrate the isolation and insulation layer 44, the drain-side second insulation layer 43, the drain-side conductive layer 42, and the drain-side first insulation layer 41 at a position aligned with the upper portion of the memory columnar semiconductor layer 34. Thereafter, a drain-side gate insulation layer 46 and a drain-side columnar semiconductor layer 47 are sequentially formed on the sidewall of the drain-side hole 45, thereby manufacturing the non-volatile semiconductor storage device 100 as illustrated in FIG. 4.

(Advantages of Non-Volatile Semiconductor Storage Device 100 in First Embodiment)

Advantages of the non-volatile semiconductor storage device 100 according to the first embodiment will now be described below. As can be seen from the above lamination structure, the non-volatile semiconductor storage device 100 according to the first embodiment may achieve high integration. In addition, as described in the above manufacturing processes of the non-volatile semiconductor storage device 100, each layer corresponding to a respective memory transistor MTrmn, source-side selection transistors SSTrmn, and drain-side selection transistors SDTrmn may be manufactured in a predetermined number of lithography steps, irrespective of the number of laminated layers. That is, the non-volatile semiconductor storage device 100 may be manufactured at a lower cost.

Now considering that memory strings are formed using a manufacturing method different from the first embodiment of the present invention. For example, given that this different manufacturing method includes the following steps: sequentially depositing a block insulation layer, a charge accumulation layer, and a tunnel insulation layer on the surface of a hole, removing those portions of the tunnel insulation layer, the charge accumulation layer, and the block insulation layer that are located at the bottom surface of the hole, removing any natural oxide film on the semiconductor surface exposed on the bottom surface of the hole, depositing polysilicon within the hole, and forming a columnar semiconductor.

However, in the different manufacturing method, the tunnel insulation layer, etc., that is formed on the sidewall of the hole is also removed by the hydrofluoric acid treatment used in removing any natural oxide film on the semiconductor surface. In addition, if the tunnel insulation layer is composed of other material than oxide film to eliminate these problems with the hydrofluoric acid treatment, the different manufacturing method may cause charge trapping in the other material. That is, problems arise that lead to reduction in reliability.

On the contrary, the non-volatile semiconductor storage device 100 according to the first embodiment of the present invention has the charge accumulation layer 36 formed on the memory columnar semiconductor layer 34 via the air gap 35. The air gap 35 has a predetermined permittivity and the same functionality as, so to speak, a tunnel insulation layer.

Accordingly, in the first embodiment of the present invention, hydrofluoric acid treatment is performed with the charge accumulation layer 36 protected by the sacrificial layer 39. Then, after forming the memory columnar semiconductor layer 34, the sacrificial layer 39 is removed to form the air gap 35. This means that the non-volatile semiconductor storage device 100 can suppress degraded reliability problems due to the charge trapping in the other material, etc., caused in the different manufacturing method for the following reasons: it may provide contact between the memory columnar semiconductor layer 34 and the source-side columnar semiconductor layer 26, and it may form the air gap 35 (with the same functionality as a tunnel insulation layer), the charge accumulation layer 36, and the block insulation layer 37 with a preset, predetermined thickness, respectively, without being affected by the hydrofluoric acid treatment.

In addition, a part functioning as a tunnel insulation layer is composed of the air gap 35 (not composed of a insulation layer). Therefore, there is no wariness about SILC (Stress Induced Leakage Current) caused by the passing charge, so the non-volatile semiconductor storage device 100 can suppress degraded reliability problems.

[Second Embodiment]

(Specific Configuration of Memory Strings MS in Second Embodiment)

Figure 11A:
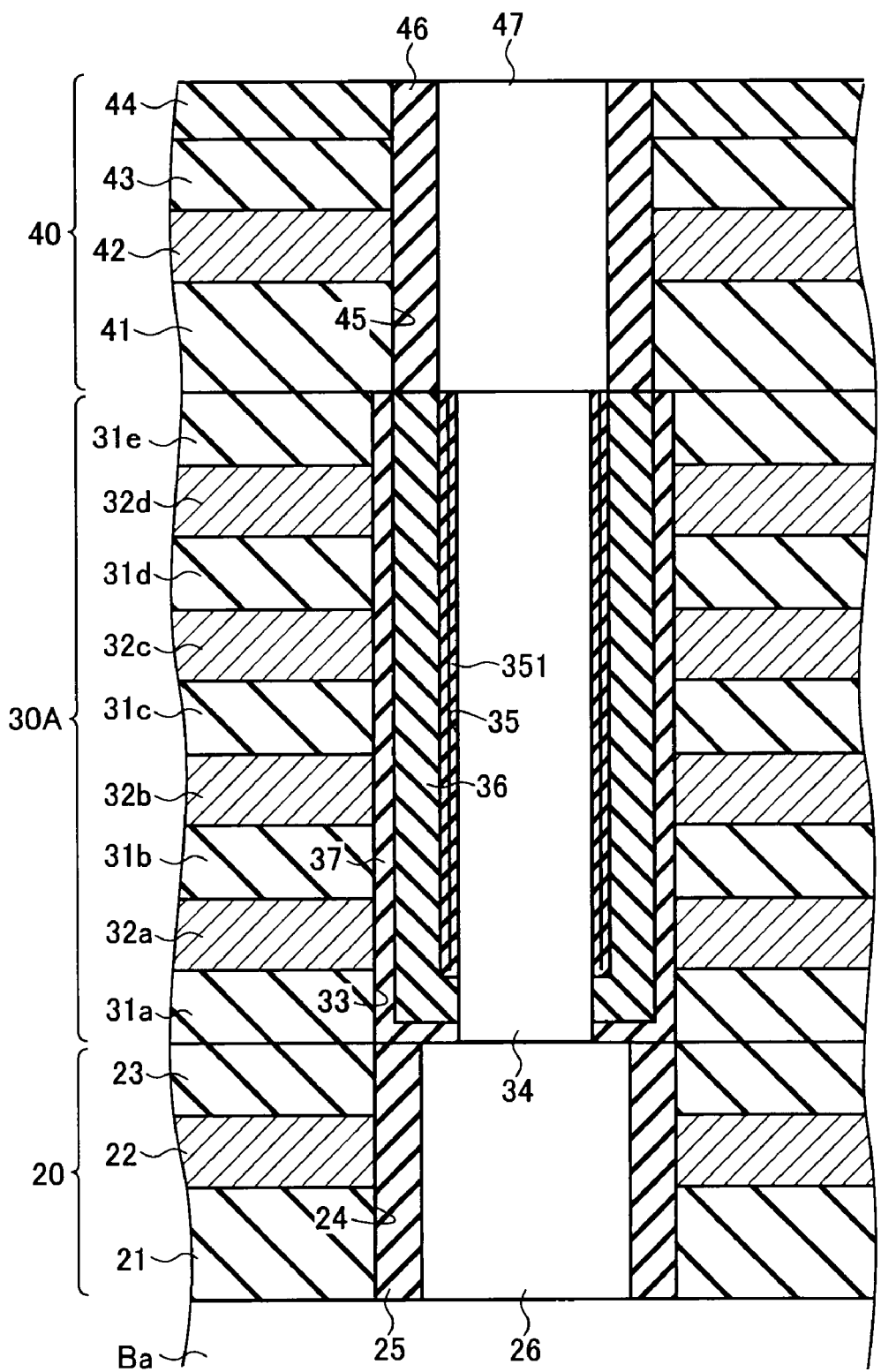
FIG. 11A is a diagram illustrating a cross-sectional structure of one of the memory strings MS according to a second embodiment.
Figure 11B:
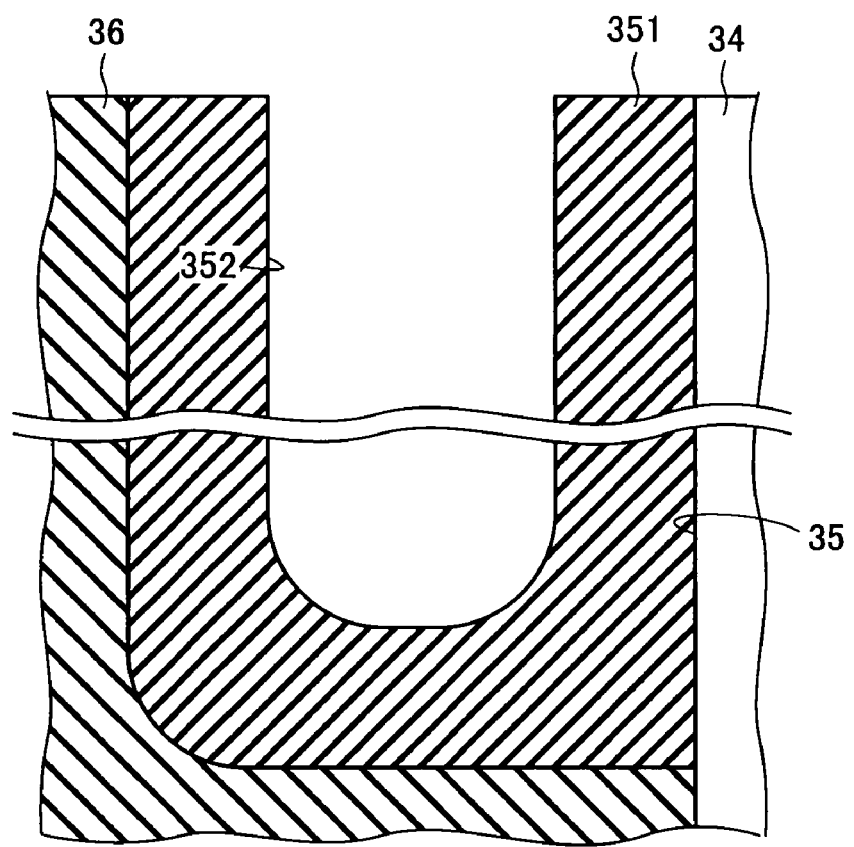
FIG. 11B is an enlarged view of FIG. 11A.

Referring now to FIGS. 11A and 11B, a specific configuration of one of memory strings MS in a non-volatile semiconductor storage device according to a second embodiment of the present invention will be described below. FIG. 11A illustrates a cross-sectional structure of one of the memory strings MS according to the second embodiment; and FIG. 11B is an enlarged view of FIG. 11A. As illustrated in FIG. 11A, the non-volatile semiconductor storage device according to the second embodiment has a memory transistor layer 30A different from the first embodiment. Note that the same reference numerals represent the same components as the first embodiment and description thereof will be omitted in the second embodiment.

As illustrated in FIG. 11A, a tunnel insulation layer 351 is formed in the air gap 35 in the memory transistor layer 30A of one of the memory strings MS according to the second embodiment. The tunnel insulation layer 351 is formed by silicon oxide. As illustrated in FIG. 11B, the tunnel insulation layer 351 is formed to cover the sidewall of the memory columnar semiconductor layer 34 and the sidewall and bottom portion of the charge accumulation layer 36. The tunnel insulation layer 351 has an air gap 352. In addition, the tunnel insulation layer 351 may be formed to fill up the air gap 352 and made in a shape with a seam from its upper end toward its lower end. Further, unlike the first embodiment, the sealing and insulating layer 38 is not formed on the tunnel insulation layer 351.

In other words, regarding the configuration of the second embodiment, the tunnel insulation layer 351 is formed in contact with the memory columnar semiconductor layer 34, while the charge accumulation layer 36 is formed in contact with that tunnel insulation layer 351.

(Manufacturing Process of Memory Strings MS in Second Embodiment)

A manufacturing process of one of the memory strings MS according to the second embodiment will now be described below. Similar operations occur in the manufacturing process of one of the memory strings MS according to the second embodiment, as illustrated in FIGS. 5 through 8 for the first embodiment. Following the process of FIG. 8, a step of forming a silicon oxide film is performed by a process with a good embedding property (coverage) (e.g., Low Pressure Chemical Vapor Deposition (LPCVD)). Through this process, a tunnel insulation layer (second insulation layer) 351 is formed in the air gap 35.

Then, after forming the tunnel insulation layer 351, similar operations occur as illustrated in FIGS. 9 and 10, thereby manufacturing the non-volatile semiconductor storage device as illustrated in FIG. 11A.

(Advantages of Non-Volatile Semiconductor Storage Device in Second Embodiment)

Similar to the first embodiment, the non-volatile semiconductor storage device according to the second embodiment may be manufactured in a predetermined number of lithography steps, irrespective of the number of laminated layers, and manufactured at a lower cost.

In addition, similar to the first embodiment, the air gap 35 is first formed and then the tunnel insulation layer 351 is formed in the air gap 35 in the non-volatile semiconductor storage device according to the second embodiment.

Accordingly, similar to the first embodiment, the non-volatile semiconductor storage device according to the second embodiment can suppress degraded reliability problems due to the charge trapping in the other material, etc., caused in the different manufacturing method for the following reasons: it may provide contact between the memory columnar semiconductor layer 34 and the source-side columnar semiconductor layer 26, and it may form the tunnel insulation layer 351, the charge accumulation layer 36, and the block insulation layer 37 with a preset, predetermined film thickness, respectively, without being affected by the hydrofluoric acid treatment.

[Third Embodiment]

(Specific Configuration of Memory Strings MS in Third Embodiment)

Figure 12:
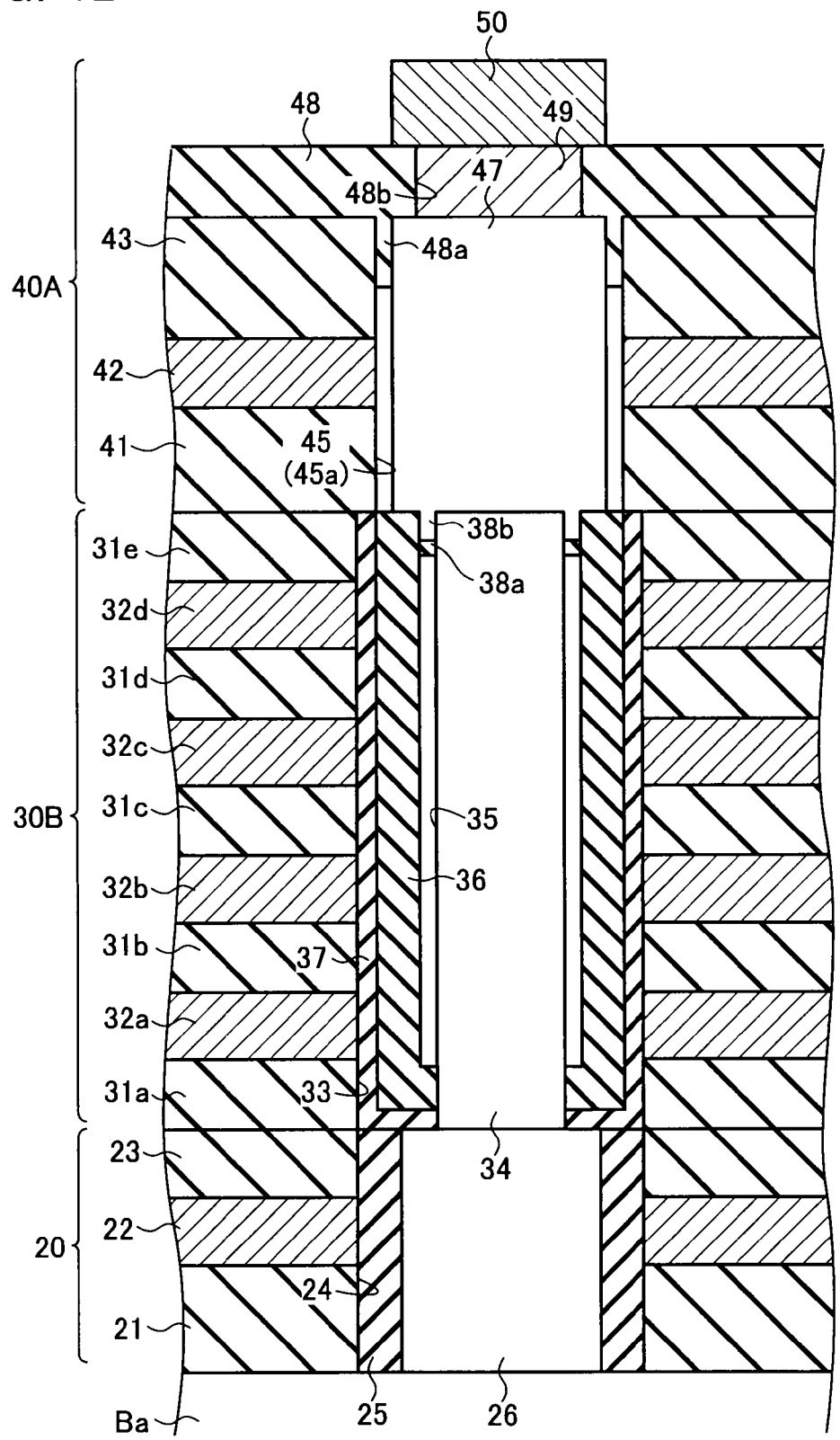
FIG. 12 is a diagram illustrating a cross-sectional structure of one of the memory strings MS according to a third embodiment.

Referring now to FIG. 12, a specific configuration of one of memory strings MS in a non-volatile semiconductor storage device according to a third embodiment of the present invention will be described below. As illustrated in FIG. 12, one of the memory strings MS according to the third embodiment has a memory transistor layer 30B and a drain-side selection transistor layer 40A different from the first and second embodiments. Note that the same reference numerals represent the same components as the first and second embodiments and description thereof will be omitted in the third embodiment.

In the memory transistor layer 30B according to the third embodiment, a sealing and insulating layer 38a is formed on the upper portion of the memory transistor layer 30B and between the memory columnar semiconductor layer 34 and the charge accumulation layer 36, sealing the top of the space made by the air gap 35. The sealing and insulating layer 38a is formed in such a way that its top surface is positioned below the top surface of the memory columnar semiconductor layer 34. Further, a sealing semiconductor layer 38b is formed on the sealing and insulating layer 38a. The sealing semiconductor layer 38b extends from the drain-side columnar semiconductor layer 47.

In the drain-side selection transistor layer 40A according to the third embodiment, the drain-side gate insulation layer 46 is not formed in the drain-side hole 45. This means that there is provided an air gap 45a between the sidewall of the drain-side hole 45 (the drain-side conductive layer 42) and the drain-side columnar semiconductor layer 47. In other words, regarding this configuration, the drain-side conductive layer 42 is formed on the drain-side columnar semiconductor layer 47 via the air gap 45a.

In addition, in the drain-side selection transistor layer 40A according to the third embodiment, the isolation and insulation layer 44 is not formed on the drain-side second insulation layer 43, but instead, a sealing and insulating layer 48 is formed to fill up the upper portion of the air gap 45a. The sealing and insulating layer 48 has a protrusion portion 48a that protrudes from its lower end to the upper portion of the air gap 45a and a plug hole 48b that is formed at a position aligned with the upper portion of the drain-side columnar semiconductor layer 47. A plug conductive layer 49 is formed in the plug hole 48b. A bit-line conductive layer 50 is formed on the top surface of the plug conductive layer 49. The above-mentioned sealing and insulating layer 48 is formed by silicon nitride and the plug conductive layer 49 is formed by tungsten (W). In addition, the plug conductive layer 49 may be configured to have a barrier metal layer thereon, such as Ti/TiN.

(Manufacturing Process of Memory Strings MS in Third Embodiment)

Referring now to FIGS. 13 through 20, a manufacturing process of one of the memory strings MS according to the third embodiment will be described below. Note that some of the first to fifth insulation layers between word lines 31a to 31e and some of the first to fourth word-line conductive layers 32a to 32d are omitted from FIGS. 13 through 20.

Figure 13:
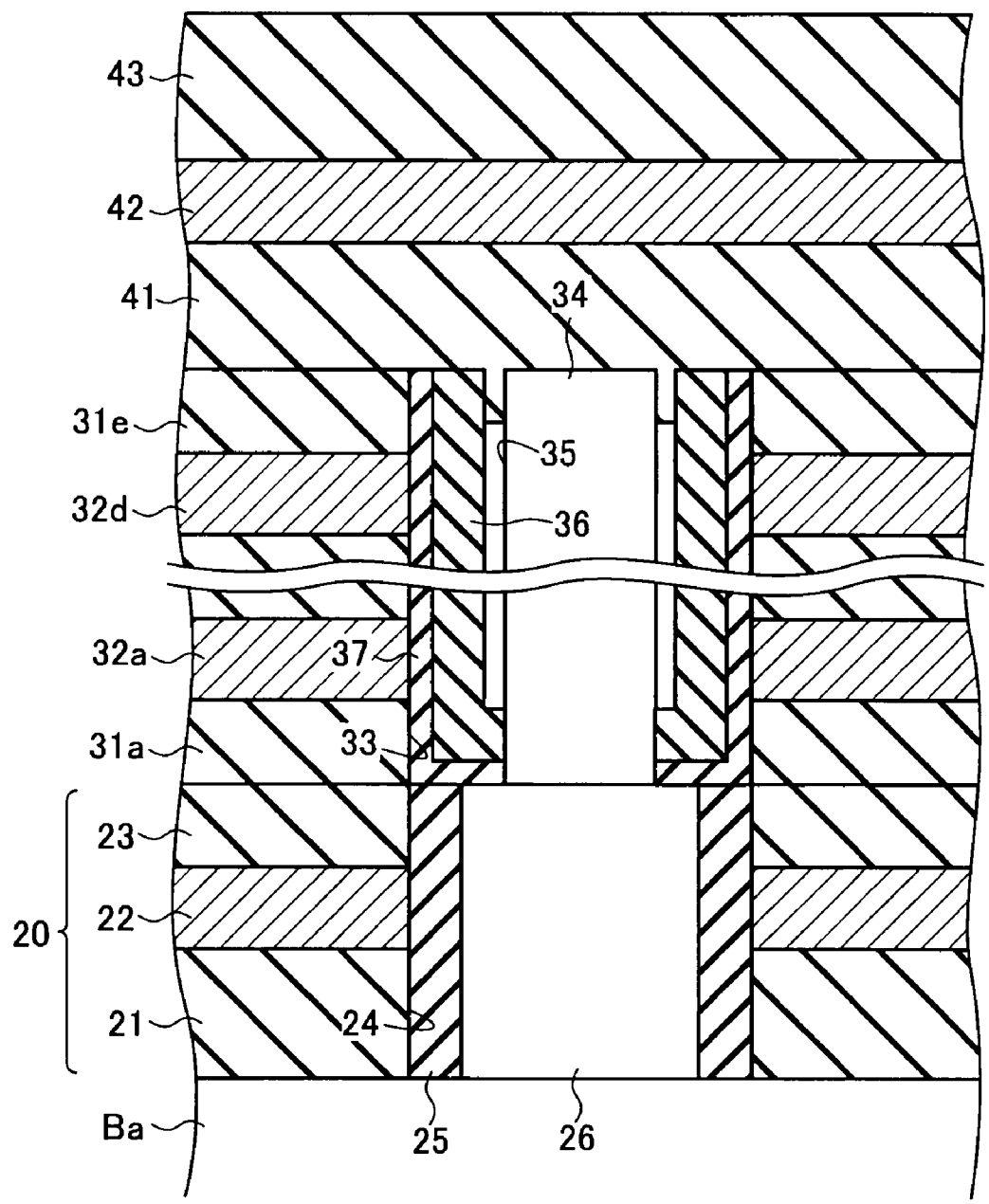
FIG. 13 is a cross-sectional view of one of the memory strings MS in a manufacturing process according to the third embodiment.

Firstly, similar operations occur in the manufacturing process of one of the memory strings MS according to the third embodiment until that illustrated in FIG. 9 regarding the manufacturing process of one of the memory strings MS according to the first embodiment. Following the process of FIG. 9, as illustrated in FIG. 13, polysilicon and silicon oxide are sequentially laminated on the drain-side first insulation layer 41 to form a drain-side conductive layer (second conductive layer) 42 and a drain-side second insulation layer 43.

Figure 14:
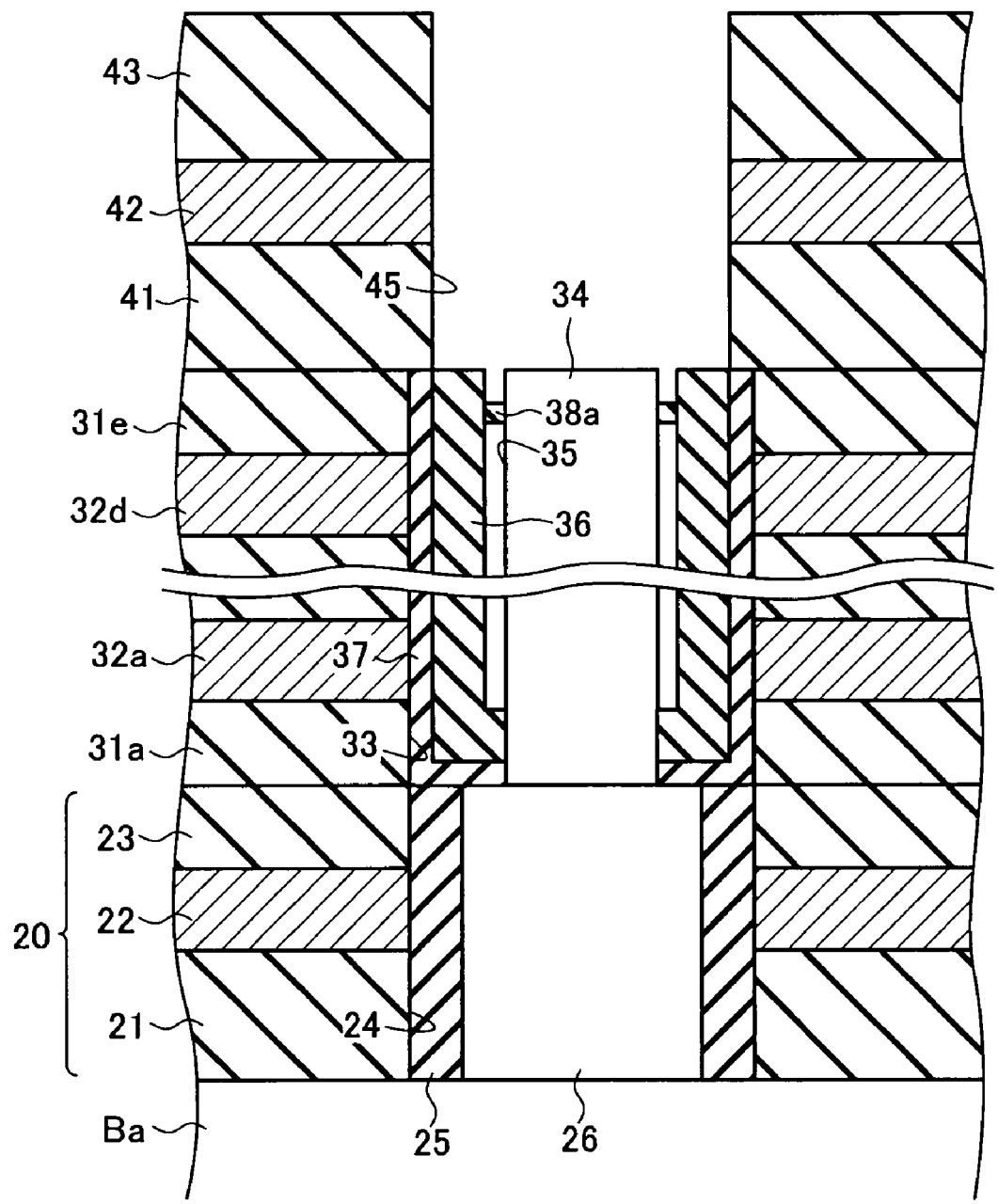
FIG. 14 is a cross-sectional view of one of the memory strings MS in the manufacturing process according to the third embodiment.

Then, as illustrated in FIG. 14, a drain-side hole 45 is formed to penetrate the drain-side second insulation layer 43, the drain-side conductive layer 42, and the drain-side first insulation layer 41. Through this process, those portions of the drain-side first insulation layer 41 that remain in the upper portion of the air gap 35 become the sealing and insulating layer 38a.

Figure 15:
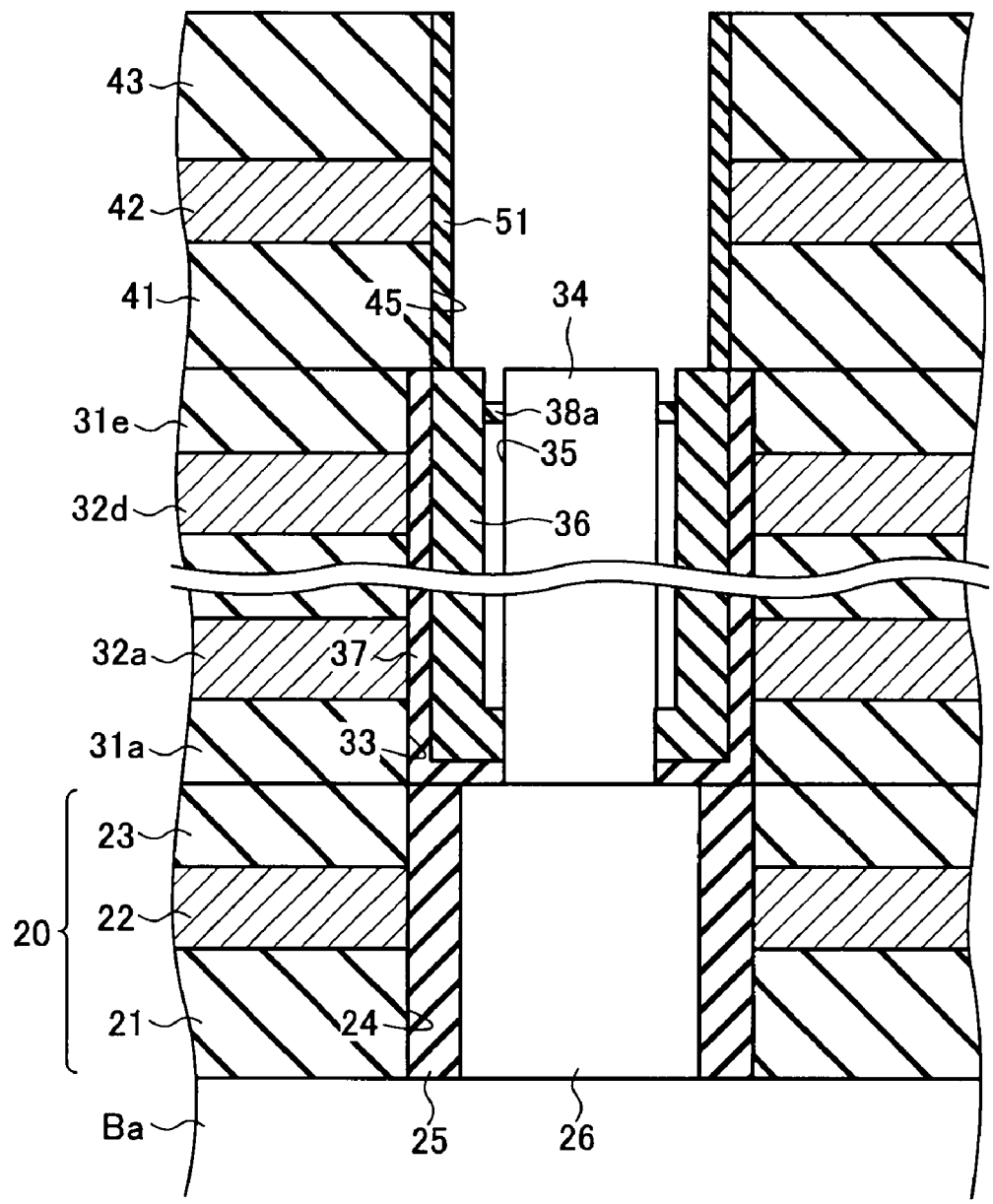
FIG. 15 is a cross-sectional view of one of the memory strings MS in the manufacturing process according to the third embodiment.

Then, a sacrificial layer 51 is formed by deposition of silicon germanium (e.g., 5 nm), and then those portions of the sacrificial layer 51 are removed by RIE that are located on the top surface of the bottom portion of the drain-side hole 45 and on the top surface of the drain-side second insulation layer 43. The resulting state of this process is depicted in FIG. 15. Further, hydrofluoric acid treatment is performed to remove any natural oxide film that is formed on the top surface of the memory columnar semiconductor layer 34 exposed on the bottom surface of the drain-side hole 45.

Figure 16:
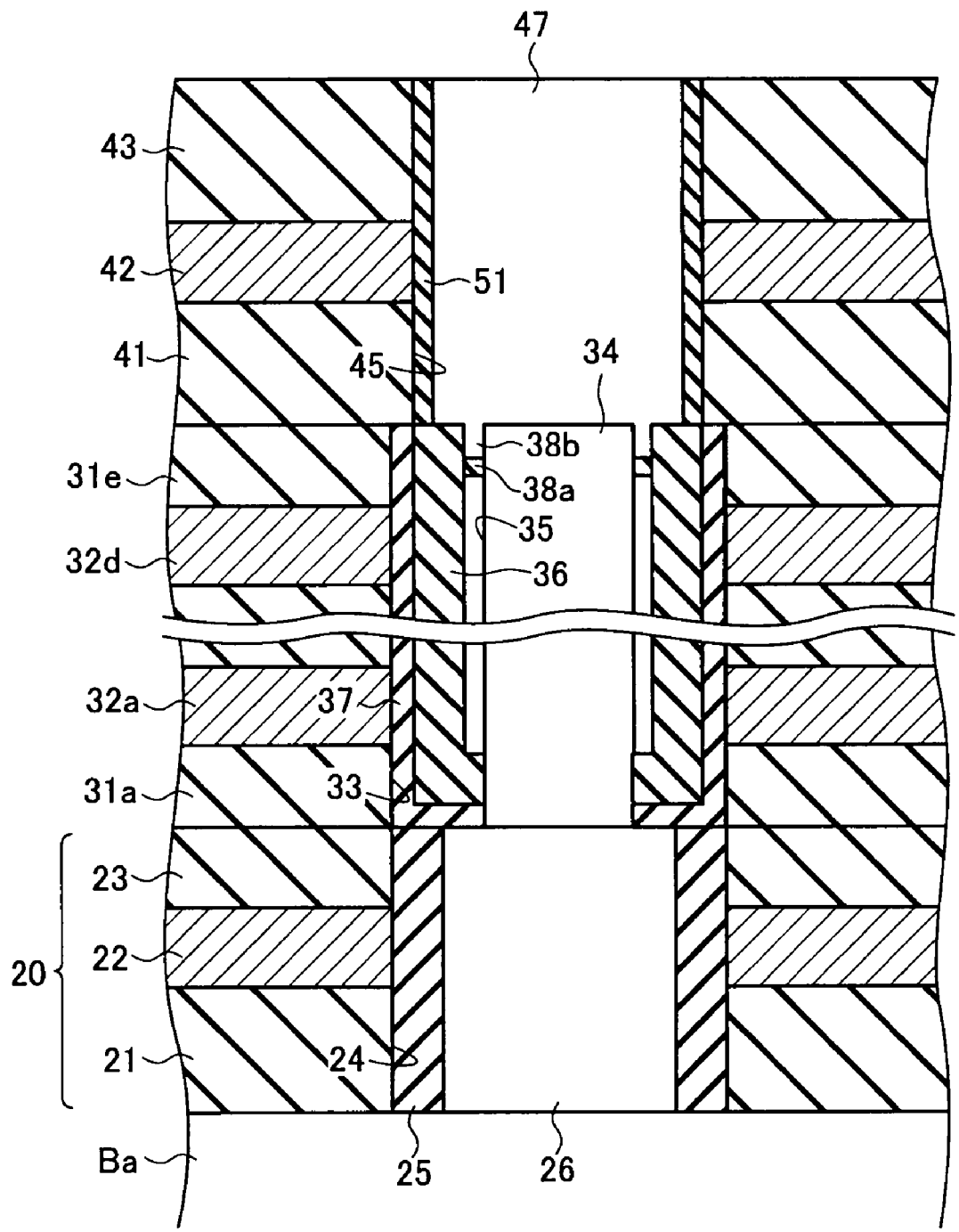
FIG. 16 is a cross-sectional view of one of the memory strings MS in the manufacturing process according to the third embodiment.

Then, as illustrated in FIG. 16, polysilicon is deposited within the drain-side hole 45 so as to contact the sacrificial layer 51, by which a drain-side columnar semiconductor layer 47 is formed in the drain-side hole 45. Note that the polysilicon deposited in this process on the sealing and insulating layer 38a becomes the sealing semiconductor layer 38b.

Figure 17:
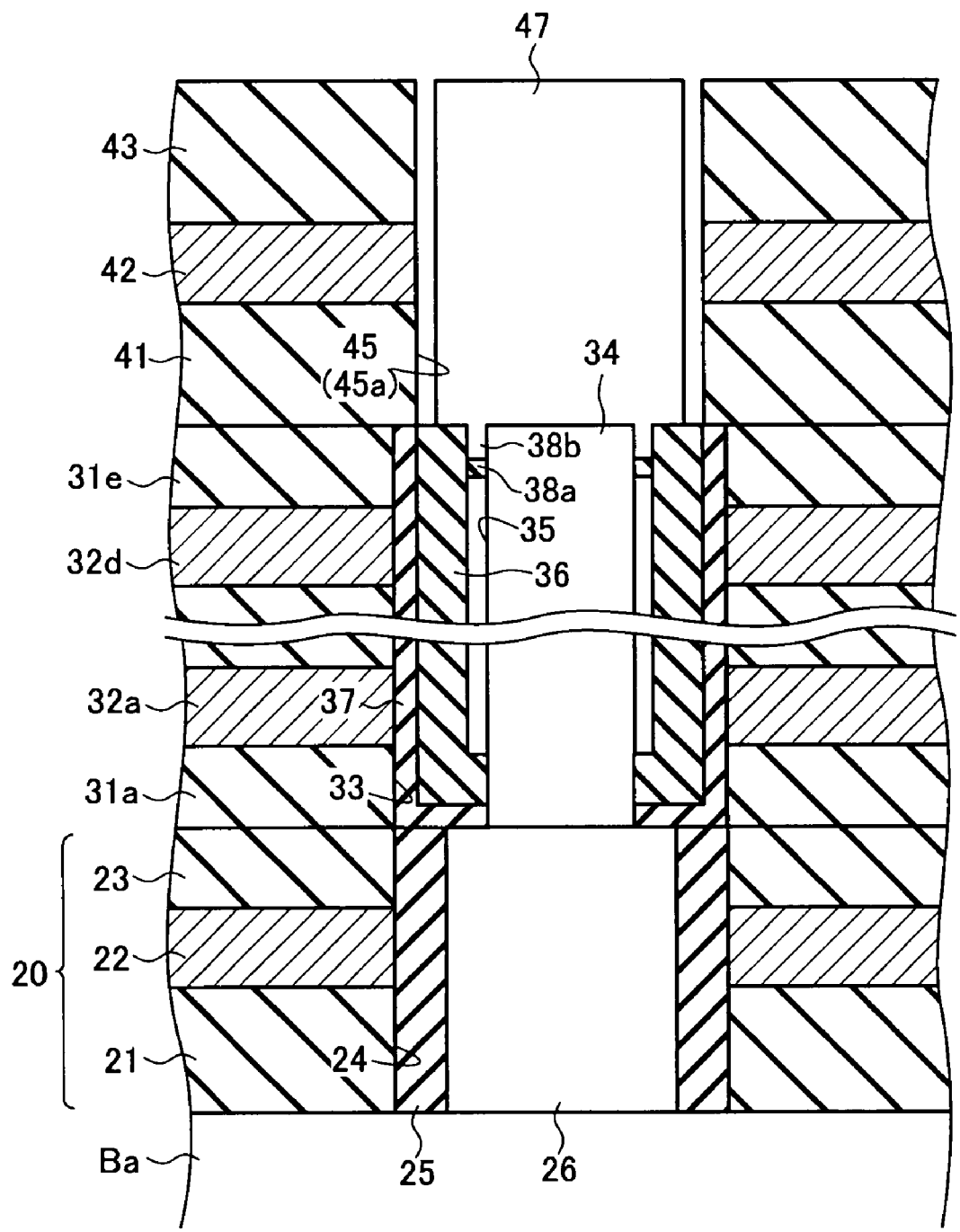
FIG. 17 is a cross-sectional view of one of the memory strings MS in the manufacturing process according to the third embodiment.

Then, as illustrated in FIG. 17, the sacrificial layer 51 is removed by selective etching to form a hollow cylindrical air gap (trench) 45a. Note that the selective etching is performed in, e.g., a $ClF_3$ vapor atmosphere since the sacrificial layer 51 is of silicon germanium.

Figure 18:
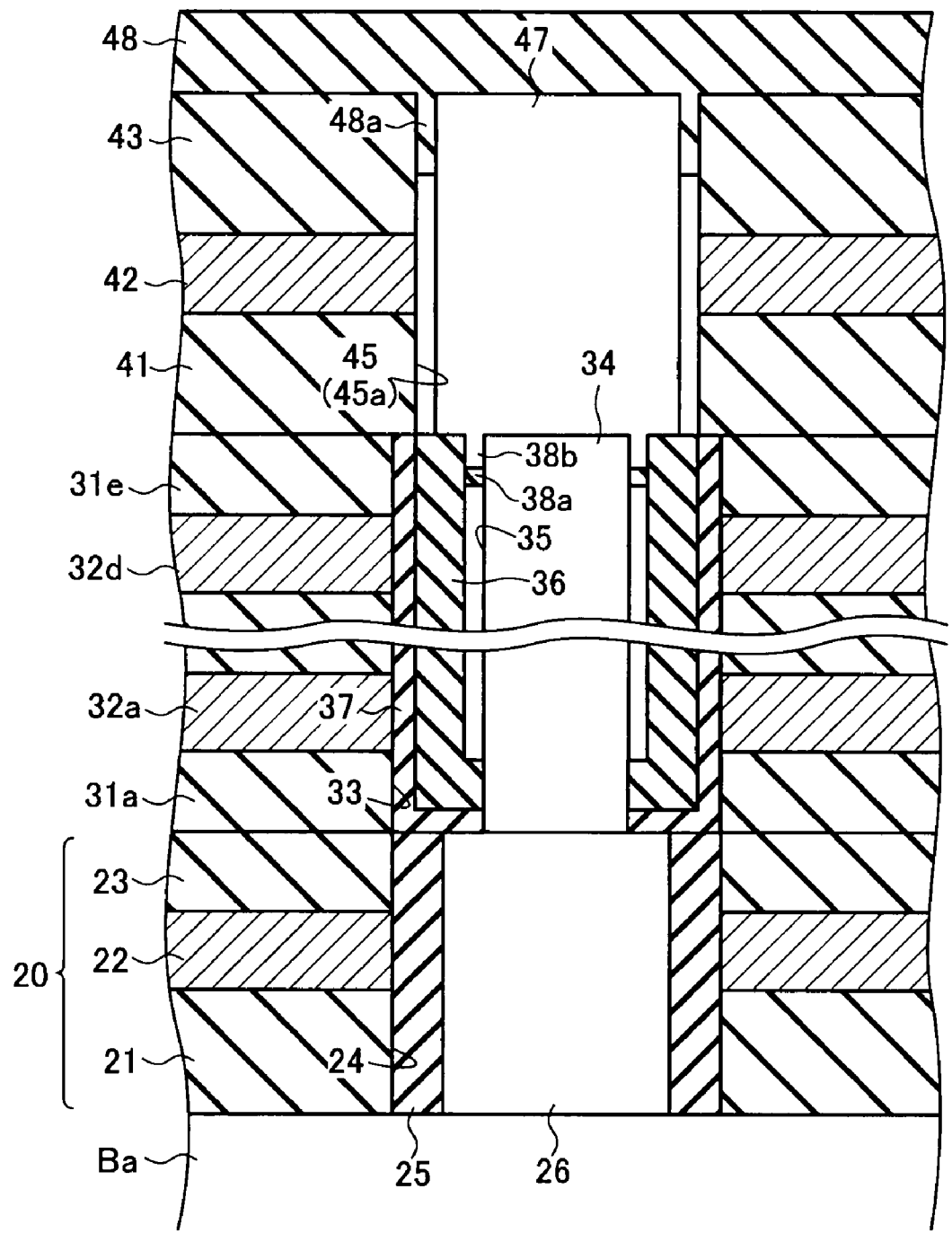
FIG. 18 is a cross-sectional view of one of the memory strings MS in the manufacturing process according to the third embodiment.

Then, as illustrated in FIG. 18, a silicon oxide film is formed by a process with a poor embedding property (coverage) (e.g., plasma CVD). Through this process with a poor embedding property (coverage), a sealing and insulating layer 48 is formed to seal the upper aperture of the air gap 45a without filling up the entire air gap 45a with the silicon oxide film. Note that a protrusion portion 48a of the sealing and insulating layer 48 is formed in the upper portion of the air gap 45a.

Figure 19:
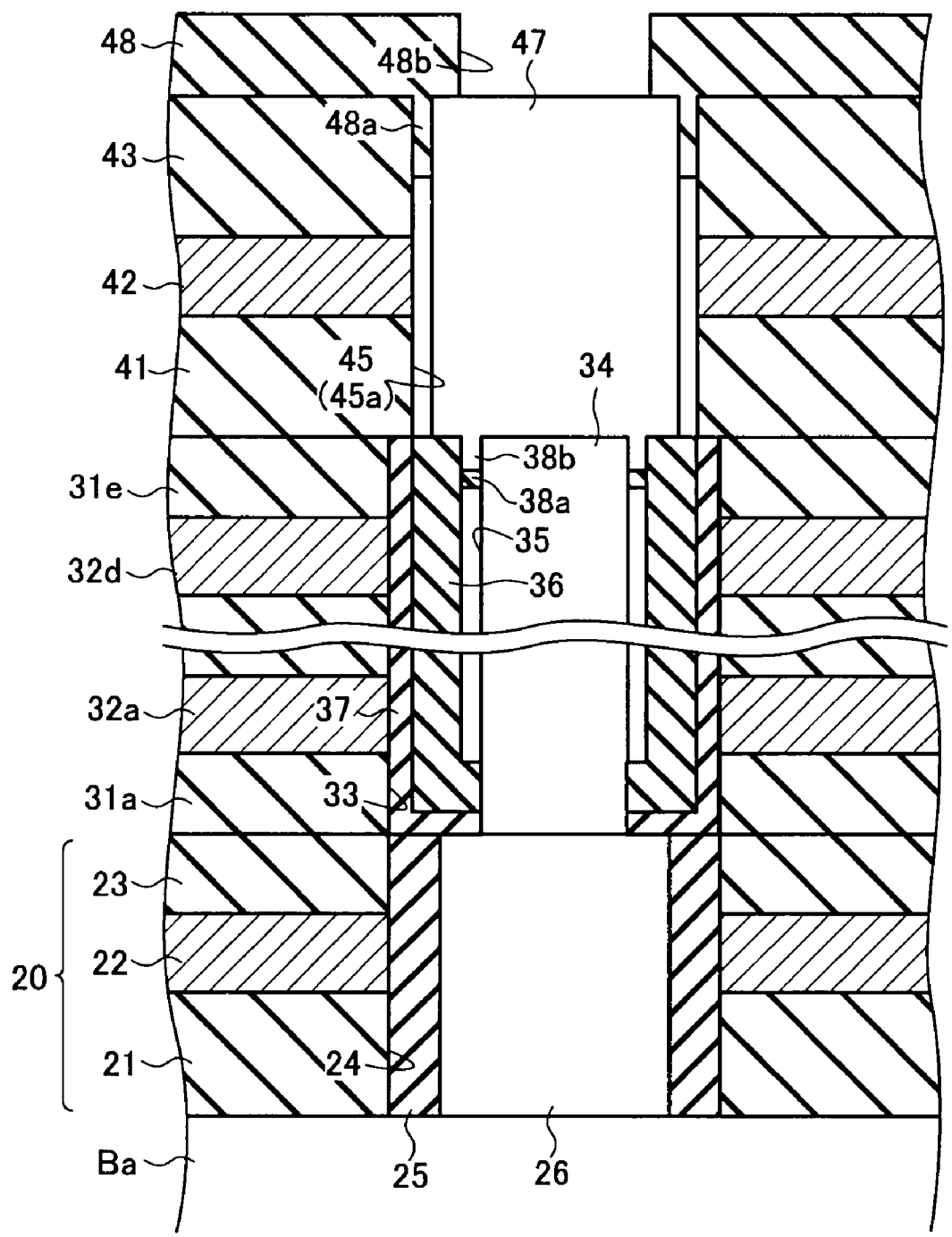
FIG. 19 is a cross-sectional view of one of the memory strings MS in the manufacturing process according to the third embodiment.

Then, as illustrated in FIG. 19, a plug hole 48b is formed to penetrate the sealing and insulating layer 48 at a position aligned with the upper portion of the drain-side columnar semiconductor layer 47.

Figure 20:
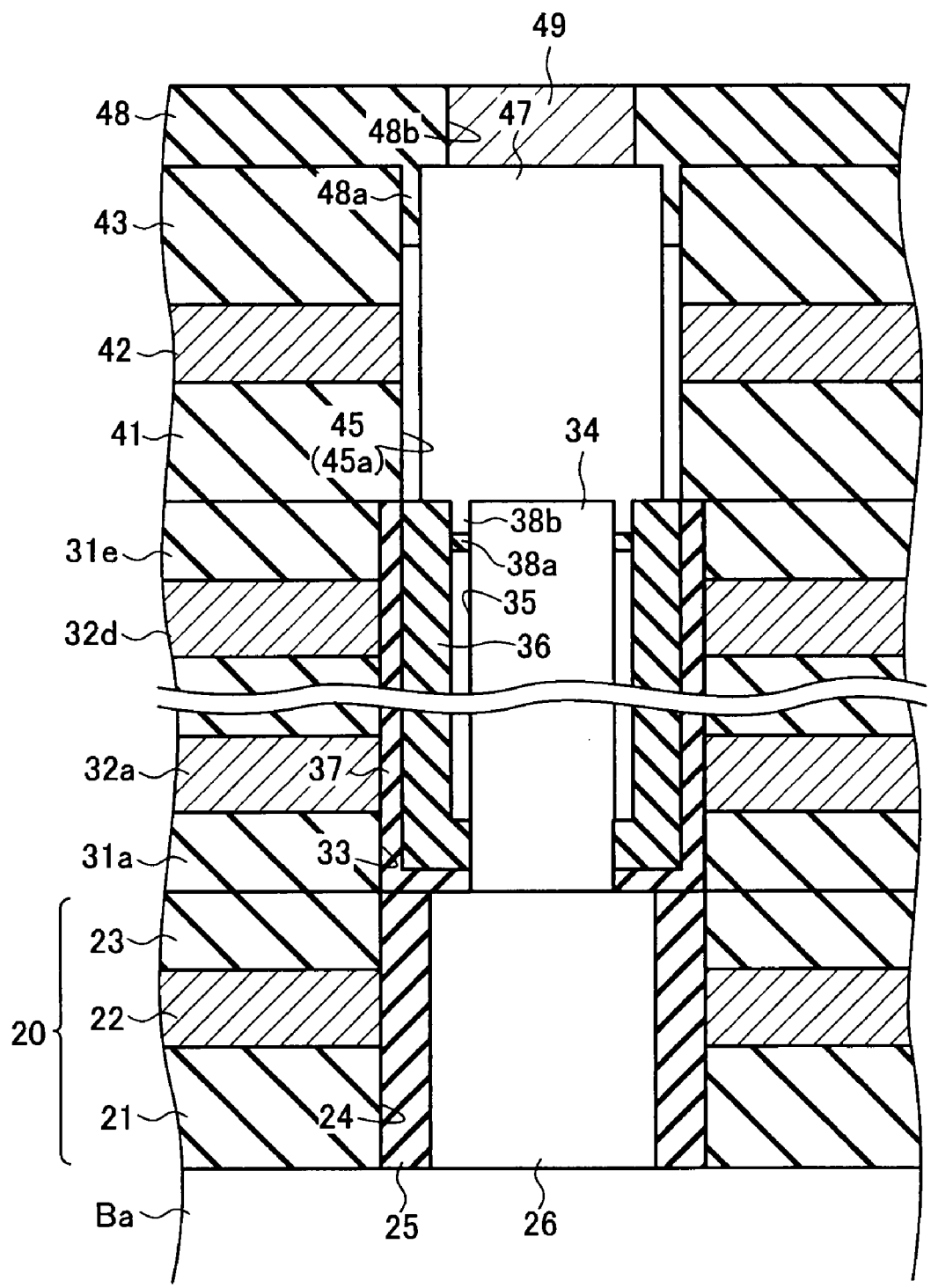
FIG. 20 is a cross-sectional view of one of the memory strings MS in the manufacturing process according to the third embodiment.

Then, as illustrated in FIG. 20, a tungsten layer is deposited in the plug hole 48b to form a plug conductive layer 49. Following the process of FIG. 20, a bit-line conductive layer 50 is formed on the plug conductive layer 49, thereby manufacturing the non-volatile semiconductor storage device as illustrated in FIG. 12.

The non-volatile semiconductor storage device according to the third embodiment has the air gap 35, providing the same advantages as the first embodiment.

In addition, the non-volatile semiconductor storage device according to the third embodiment has the air gap 45a between the drain-side columnar semiconductor layer 47 and the drain-side first insulation layer 41, the drain-side conductive layer 42, the drain-side second insulation layer 43. Further, the air gap 45a has a predetermined permittivity and the same functionality as, so to speak, a drain-side gate insulation layer.

Accordingly, hydrofluoric acid treatment is performed with the drain-side first insulation layer 41, the drain-side conductive layer 42, and the drain-side second insulation layer 43 protected by the sacrificial layer 51. Then, after forming the drain-side columnar semiconductor layer 47, the sacrificial layer 51 is removed to form the air gap 45a. This means that the non-volatile semiconductor storage device can suppress degraded reliability problems due to the charge trapping in the other material, etc., caused in the different manufacturing method for the following reasons: it may provide contact between the drain-side columnar semiconductor layer 47 and the memory columnar semiconductor layer 34, and it may form an air gap 45a (with the same functionality as a gate insulation layer) with a preset, predetermined thickness, respectively, without being affected by the hydrofluoric acid treatment.

In addition, when the device operates, electron is generated by GIDL (Gate Induced Drain Leakage) on the edge of the drain-side selection gate line SGD. Conventionally, the electron is trapped in the drain-side gate insulation layer. Namely, there is a wariness about threshold change. However, the non-volatile semiconductor storage device according to the third embodiment has the air gap 45a, instead of the drain-side gate insulation layer. Therefore, there is no wariness about threshold change in the third embodiment.

[Fourth Embodiment]

(Specific Configuration of Memory Strings MS in Fourth Embodiment)

Figure 21A:
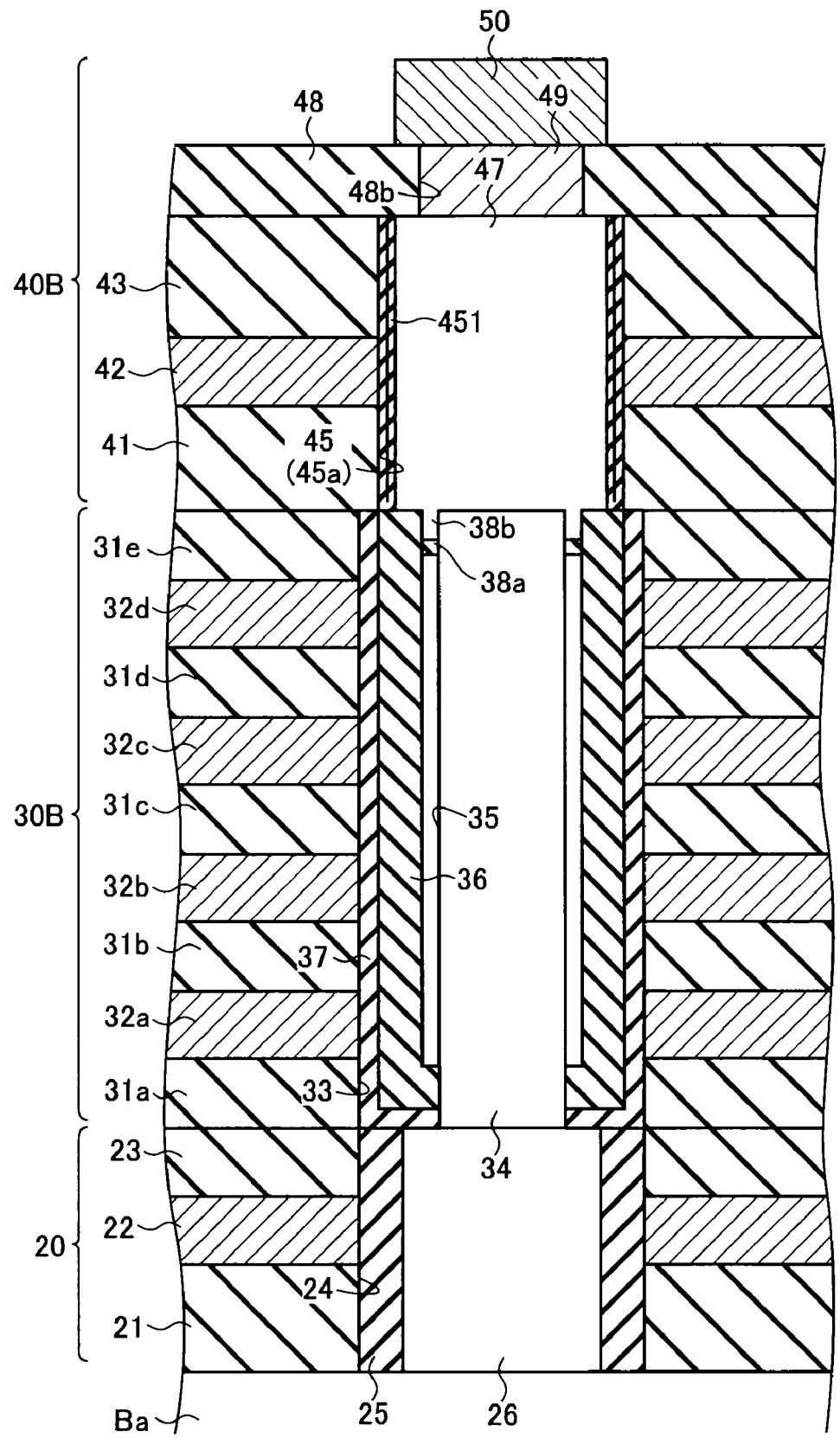
FIG. 21A is a diagram illustrating a cross-sectional structure of one of the memory strings MS according to a fourth embodiment.
Figure 21B:
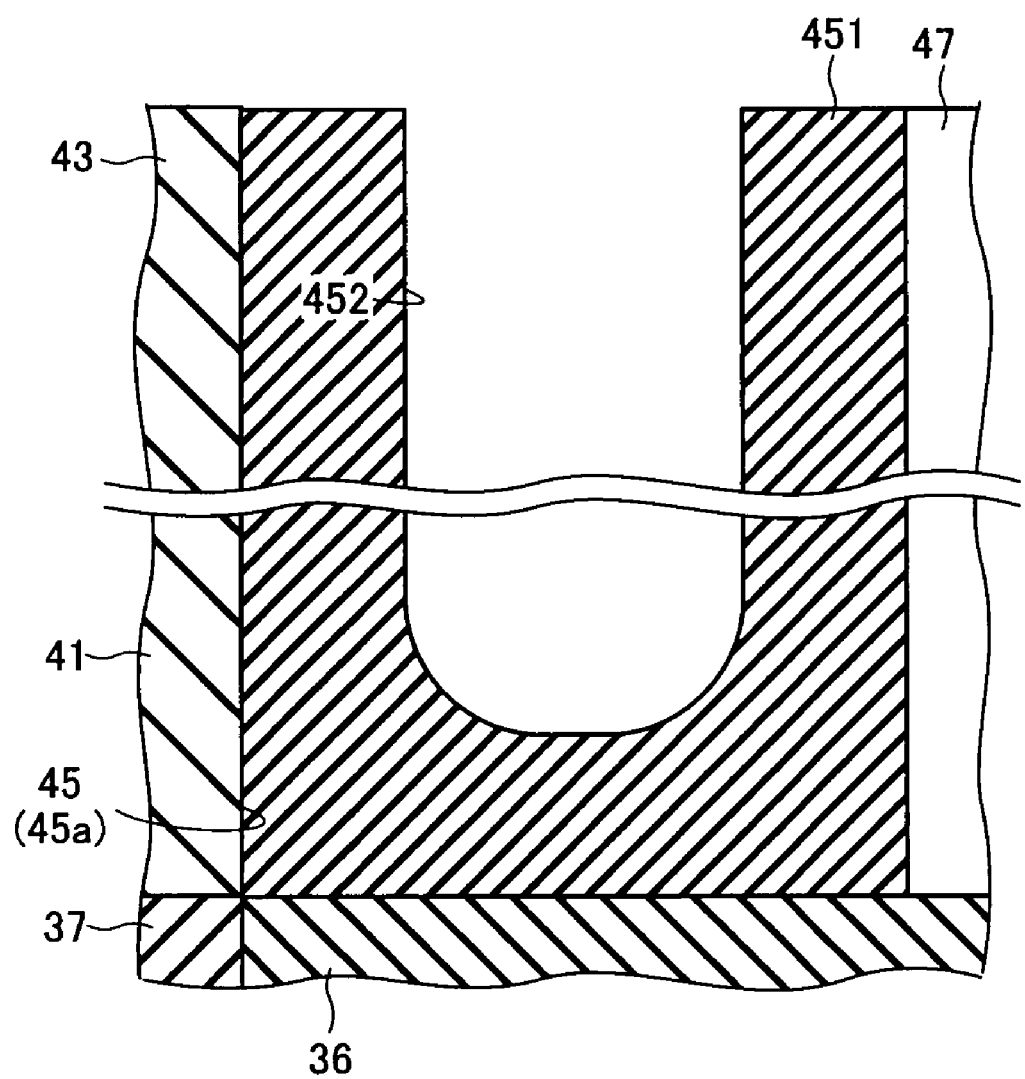
FIG. 21B is an enlarged view of FIG. 21A.

Referring now to FIGS. 21A and 21B, a specific configuration of one of memory strings MS in a non-volatile semiconductor storage device according to a fourth embodiment of the present invention will be described below. FIG. 21A illustrates a cross-sectional structure of one of the memory strings MS according to the fourth embodiment; and FIG. 21B is an enlarged view of FIG. 21A. As illustrated in FIG. 21A, one of the memory strings MS according to the fourth embodiment has a drain-side selection transistor layer 40B different than the third embodiment. Note that the same reference numerals represent the same components as the first to third embodiments and description thereof will be omitted in the fourth embodiment.

As illustrated in FIG. 21A, in the drain-side selection transistor layer 40B of one of the memory strings MS according to the fourth embodiment, a drain-side gate insulation layer 451 is formed in the air gap 45a. The drain-side gate insulation layer 451 is formed by silicon oxide. As illustrated in FIG. 21B, the drain-side gate insulation layer 451 is formed to cover the sidewall of the drain-side first insulation layer 41, the sidewall of the drain-side conductive layer 42, the sidewall of the drain-side second insulation layer 43, the upper portion of the charge accumulation layer 36, and the sidewall of the drain-side columnar semiconductor layer 47. The drain-side gate insulation layer 451 has an air gap 452. In addition, the drain-side gate insulation layer 451 may be formed to fill up the air gap 452 and made in a shape with a seam from its upper end toward its lower end. Further, unlike the third embodiment, the protrusion portion 48a of the sealing and insulating layer 48 is not formed on the drain-side gate insulation layer 451.

In other words, regarding the configuration of the fourth embodiment, the drain-side gate insulation layer 451 is formed in contact with the drain-side columnar semiconductor layer 47, while the drain-side conductive layer 42 is formed in contact with the drain-side gate insulation layer 451.

(Manufacturing Process of Memory Strings MS in Fourth Embodiment)

A manufacturing process of one of the memory strings MS according to the fourth embodiment will now be described below. Firstly, similar operations occur in the manufacturing process of one of the memory strings MS according to the fourth embodiment, as illustrated in FIGS. 13 through 17 for the third embodiment. Following the process of FIG. 17, a step of forming a silicon oxide film is performed by a process with a good embedding property (coverage) (e.g., LPCVD). Through this process, a drain-side gate insulation layer 451 is formed in the air gap 45a.

Then, after forming the drain-side gate insulation layer 451, similar operations occur as illustrated in FIGS. 18 through 20 for the third embodiment, thereby manufacturing the non-volatile semiconductor storage device as illustrated in FIG. 21A (Advantages of Non-Volatile Semiconductor Storage Device in Fourth Embodiment)

The non-volatile semiconductor storage device according to the fourth embodiment has the air gap 35, providing the same advantages as the first embodiment.

In addition, the non-volatile semiconductor storage device according to the fourth embodiment is manufactured by the step of forming the drain-side gate insulation layer 451 in the air gap 45a between the drain-side columnar semiconductor layer 47 and the drain-side first insulation layer 41, the drain-side conductive layer 42, and the drain-side second insulation layer 43.

Accordingly, hydrofluoric acid treatment is performed prior to forming the drain-side gate insulation layer 451. This means that the non-volatile semiconductor storage device according to the fourth embodiment can suppress degraded reliability problems due to the charge trapping in the other material, etc., caused in the different manufacturing method for the following reasons: it may provide contact between the drain-side columnar semiconductor layer 47 and the memory columnar semiconductor layer 34, and it may form the drain-side gate insulation layer 451 with a preset, predetermined film thickness, respectively, without being affected by the hydrofluoric acid treatment.

While embodiments of the non-volatile semiconductor storage device have been described, the present invention is not intended to be limited to the disclosed embodiments and various other changes, additions, replacements or the like may be made thereto without departing from the spirit of the invention.

Figure 22:
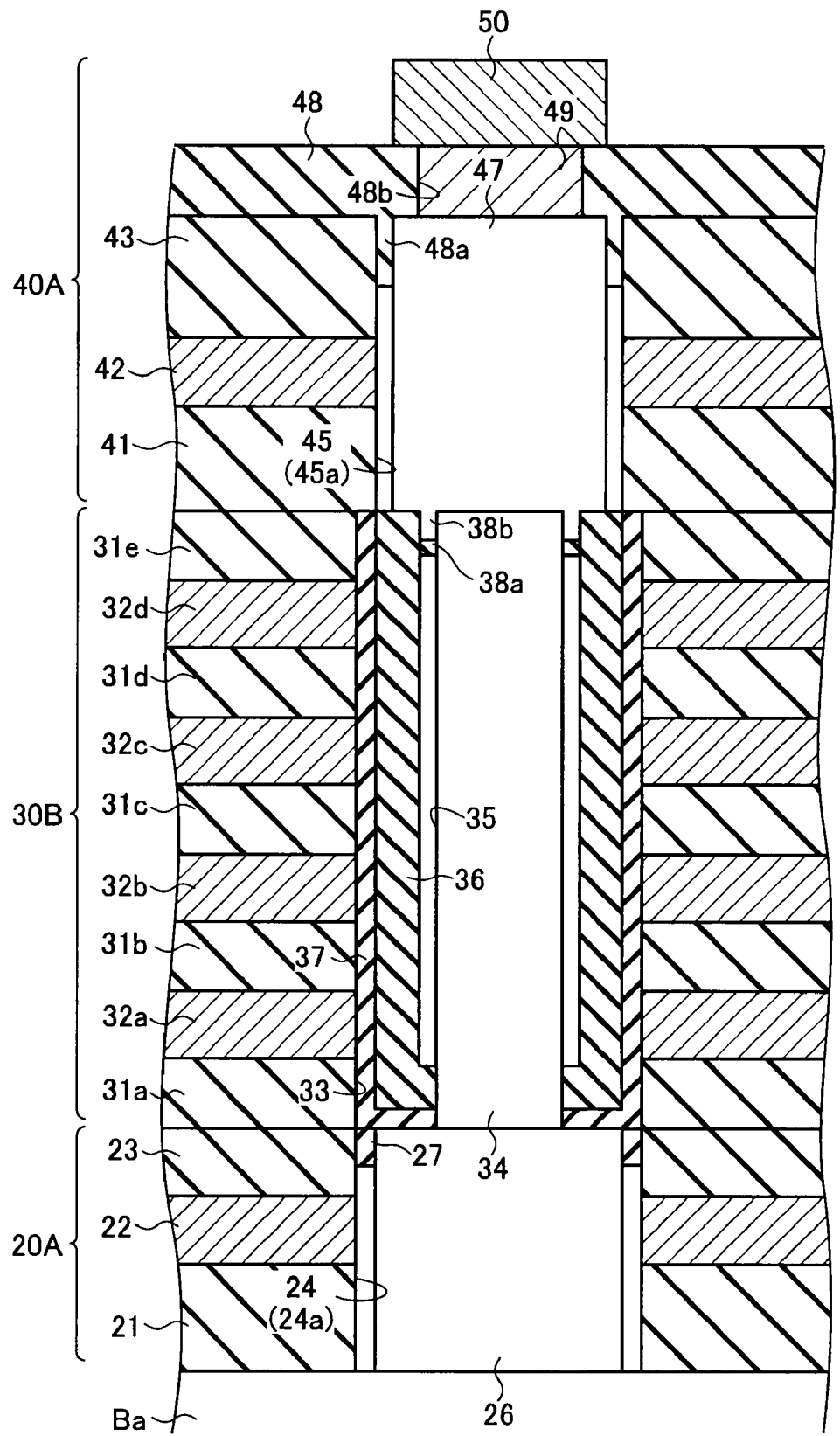
FIG. 22 is a diagram illustrating a cross-sectional structure of one of memory strings MS according to another embodiment.

For example, while in the above-mentioned embodiments the air gap 45a is involved in the drain-side selection transistor layer 40A, as illustrated in FIG. 22, an air gap 24a may also be provided between the source-side columnar semiconductor layer 26 and the source-side first insulation layer 21, the source-side conductive layer 22, and the source-side second insulation layer 23 in a source-side selection transistor layer 20A. In addition, the source-side selection transistor layer 20A comprises a sealing and insulating layer 27 that is formed to seal the top of the space made by the air gap 24a.

Figure 23A:
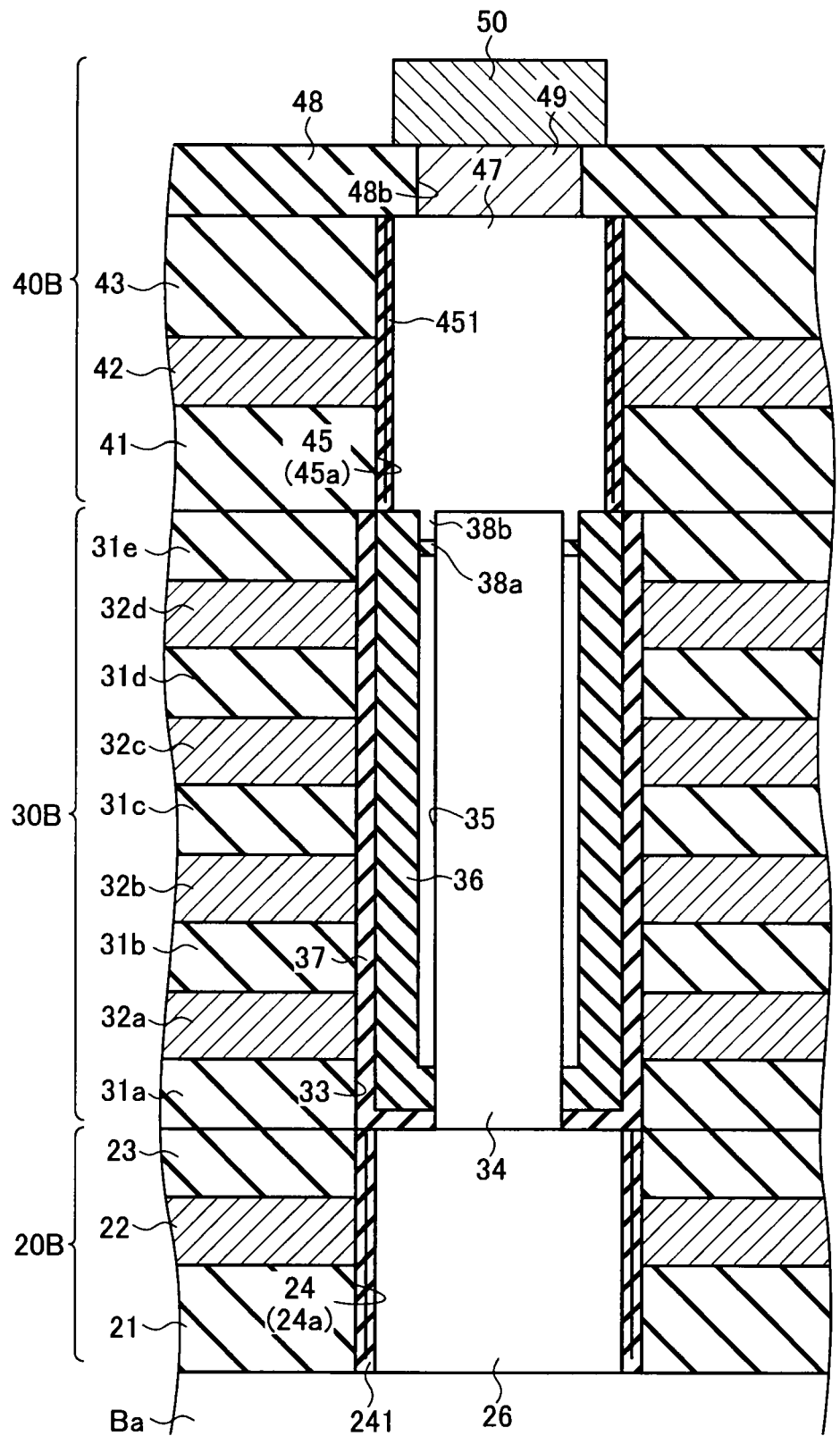
FIG. 23A is a diagram illustrating a cross-sectional structure of one of memory strings MS according to still another embodiment.
Figure 23B:
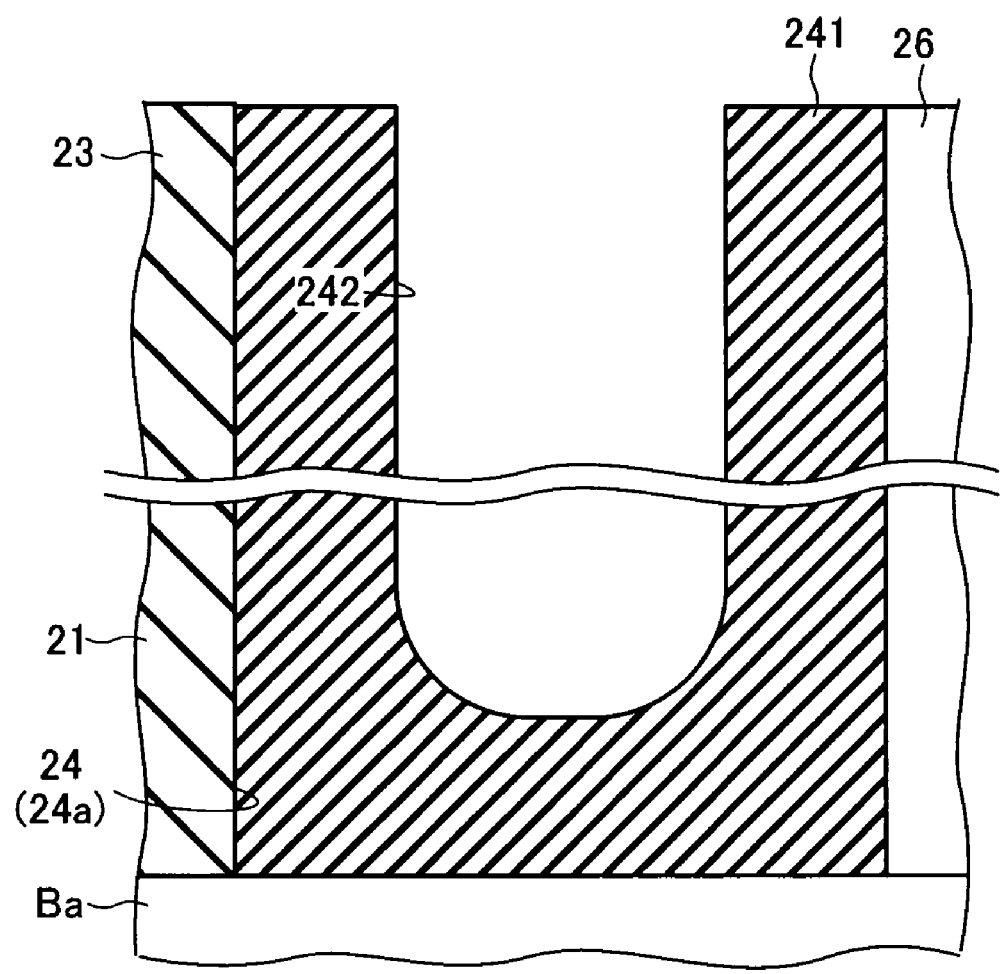
FIG. 23B is an enlarged view of FIG. 23A.

Further, for example, while in the above-mentioned embodiments the drain-side gate insulation layer 451 is involved in the air gap 45a in the drain-side selection transistor layer 40B, as illustrated in FIG. 23A, the air gap 24a may also be formed between the source-side columnar semiconductor layer 26 and the source-side first insulation layer 21, the source-side conductive layer 22, and the source-side second insulation layer 23 in a source-side selection transistor layer 20B and a source-side gate insulation layer 241 may be provided in the air gap 24a. As illustrated in FIG. 23B, the source-side gate insulation layer 241 is formed to cover the respective sidewalls of the source-side first insulation layer 21, the source-side conductive layer 22, the source-side second insulation layer 23, and the source-side columnar semiconductor layer 26. The source-side gate insulation layer 241 has an air gap 242. In addition, the source-side gate insulation layer 241 may be formed to fill up the air gap 242 and made in a shape with a seam from its upper end toward its lower end.

Further, for example, while the above-mentioned embodiments have a configuration where selective etching is performed in a ClF$_3$ vapor atmosphere using the sacrificial layers 39 and 51 of silicon germanium, Hot phosphoric acid etching may be performed using other sacrificial layers of silicon nitride.

What is claimed is:

1. A non-volatile semiconductor storage device comprising a plurality of memory strings with a plurality of electrically rewritable memory cells connected in series, and a selection gate transistor controlling whether to conduct current to the memory strings, wherein
 each of the memory strings comprises:
  a first columnar semiconductor layer extending in a direction perpendicular to a substrate;
  a charge accumulation layer formed on the first columnar semiconductor layer via a first air gap and accumulating charges;
  a block insulation layer contacting the charge accumulation layer;
  a plurality of first conductive layers contacting the block insulation layer; and
  a first sealing/insulating layer formed to seal the top of the space made by the first air gap,
  the charge accumulation layer being continuously formed over the plurality of memory cells,
 the selection gate transistor comprises:
  a second columnar semiconductor layer formed in contact with the top or bottom surface of the first columnar semiconductor layer and extending in a direction perpendicular to the substrate; and
  a second conductive layer formed along the second columnar semiconductor layer,
  the first sealing/insulating layer is formed in a position different from a position between the second columnar semiconductor layer and the second conductive layer.

2. The non-volatile semiconductor storage device according to claim 1,
 the second conductive layer is formed on the second columnar semiconductor layer via a second air gap.

3. The non-volatile semiconductor storage device according to claim 2, wherein
 the selection gate transistor further comprises a second sealing/insulating layer formed to seal the top of the space made by the second air gap.

4. The non-volatile semiconductor storage device according to claim 1,
 a gate insulation layer contacting the second columnar semiconductor layer, the second conductive layer is contacting the gate insulation layer, and the gate insulation layer has a second air gap or a seam.

5. A non-volatile semiconductor storage device comprising a plurality of memory strings with a plurality of electrically rewritable memory cells connected in series, and a selection gate transistor controlling whether to conduct current to the memory strings, wherein
 each of the memory strings comprises,
  a first columnar semiconductor layer extending in a direction perpendicular to a substrate,
  a charge accumulation layer formed around the first columnar semiconductor layer and accumulating charges,
  a block insulation layer contacting the charge accumulation layer, and
  a plurality of first conductive layers contacting the block insulation layer,
  the charge accumulation layer being continuously formed over the plurality of memory cells; and
 the selection gate transistor comprises,
  a second columnar semiconductor layer extending in a direction perpendicular to a substrate, and
  a second conductive layer formed on the second columnar semiconductor layer via a second air gap; and
  a second sealing/insulating layer configured to seal the top of the space made by the second air gap and formed in a position different from a position between the first columnar semiconductor layer and the first conductive layer.

* * * * *